United States Patent
Nabeya et al.

(10) Patent No.: US 11,958,163 B2
(45) Date of Patent: *Apr. 16, 2024

(54) SUBSTRATE HOLDING APPARATUS, ELASTIC MEMBRANE, POLISHING APPARATUS, AND METHOD FOR REPLACING ELASTIC MEMBRANE

(71) Applicant: EBARA CORPORATION, Tokyo (JP)

(72) Inventors: Osamu Nabeya, Tokyo (JP); Makoto Fukushima, Tokyo (JP); Keisuke Namiki, Tokyo (JP); Shingo Togashi, Tokyo (JP); Satoru Yamaki, Tokyo (JP); Masahiko Kishimoto, Tokyo (JP); Tomoko Owada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 247 days.

This patent is subject to a terminal disclaimer.

(21) Appl. No.: 17/511,340

(22) Filed: Oct. 26, 2021

(65) Prior Publication Data

US 2022/0048157 A1   Feb. 17, 2022

Related U.S. Application Data

(63) Continuation of application No. 15/790,733, filed on Oct. 23, 2017, now Pat. No. 11,179,823.

(30) Foreign Application Priority Data

Oct. 28, 2016 (JP) .................................. 2016-211585
Mar. 31, 2017 (JP) .................................. 2017-071392

(51) Int. Cl.
*B24B 37/30* (2012.01)
*B24B 37/04* (2012.01)
(Continued)

(52) U.S. Cl.
CPC .............. *B24B 37/30* (2013.01); *B24B 37/04* (2013.01); *B24B 37/32* (2013.01); *H01L 21/304* (2013.01); *H01L 21/68721* (2013.01)

(58) Field of Classification Search
CPC ......... B24B 37/30; B24B 37/32; B24B 37/04; B24B 37/34; B24B 55/00; H01L 21/68721; H01L 21/6835; H01L 21/68
(Continued)

(56) References Cited

U.S. PATENT DOCUMENTS 6,857,945 B1   2/2005   Chen et al.
7,654,888 B2   2/2010   Zuniga et al.
(Continued)

FOREIGN PATENT DOCUMENTS

CN   1698185 A   11/2005
CN   102729137 A   10/2012
(Continued)

OTHER PUBLICATIONS

Singapore Patent Application No. 10201708713X; Search Report; dated Apr. 6, 2020; 2 pages.
(Continued)

*Primary Examiner* — Joel D Crandall
*Assistant Examiner* — Makena S Markman
(74) *Attorney, Agent, or Firm* — BakerHostetler

(57) ABSTRACT

A substrate holding apparatus which can adjust polishing profile precisely is disclosed. The substrate holding apparatus includes an elastic membrane that forms a plurality of pressure chambers for pressing a substrate, and a head body to which the elastic membrane is coupled. The elastic membrane includes a contact portion to be brought into contact with the substrate for pressing the substrate against a polishing pad, an edge circumferential wall extending upwardly from a peripheral edge of the contact portion, and (Continued)

a plurality of inner circumferential walls arranged radially inwardly of the edge circumferential wall and extending upwardly from the contact portion. At least two adjacent inner circumferential walls of the plurality of inner circumferential walls include slope circumferential walls inclined radially inwardly. The slope circumferential walls are inclined radially inwardly in their entirety from their lower ends to upper ends, and extend upwardly.

16 Claims, 22 Drawing Sheets

(51) Int. Cl.
    *B24B 37/32* (2012.01)
    *H01L 21/304* (2006.01)
    *H01L 21/687* (2006.01)

(58) Field of Classification Search
    USPC .................................................. 451/288, 398
    See application file for complete search history.

(56) References Cited

U.S. PATENT DOCUMENTS

| | | | |
|---|---|---|---|
| 8,475,231 B2* | 7/2013 | Paik | B24B 37/30 |
| | | | 451/41 |
| 8,998,677 B2* | 4/2015 | Duescher | B24B 37/32 |
| | | | 451/286 |
| D769,200 S | 10/2016 | Fukushima et al. | |
| 11,179,823 B2* | 11/2021 | Nabeya | B24B 37/30 |
| 11,472,001 B2* | 10/2022 | Cheng | B24B 37/30 |
| 2006/0199479 A1* | 9/2006 | Togawa | B24B 37/30 |
| | | | 451/59 |
| 2008/0119119 A1* | 5/2008 | Zuniga | B24B 37/32 |
| | | | 451/287 |
| 2014/0004779 A1* | 1/2014 | Namiki | B24B 37/30 |
| | | | 451/365 |
| 2014/0080385 A1 | 3/2014 | Umemoto et al. | |
| 2015/0273657 A1 | 10/2015 | Fukushima et al. | |

FOREIGN PATENT DOCUMENTS

| | | |
|---|---|---|
| CN | 103659579 A | 3/2014 |
| CN | 104942704 A | 9/2015 |
| CN | 204954606 U | 1/2016 |
| JP | 2003-173995 A | 6/2003 |
| JP | 2004-516644 A | 6/2004 |
| JP | 2014-008570 A | 1/2014 |
| JP | 2015-193070 A | 11/2015 |
| JP | 5878607 B2 | 3/2016 |
| KR | 10-1327146 B1 | 11/2013 |
| WO | WO 2000/051782 A1 | 9/2000 |

OTHER PUBLICATIONS

U.S. Appl. No. 15/790,733; Non-Final Office Action; dated Mar. 18, 2020; 10 pages.
U.S. Appl. No. 15/790,733; Final Office Action; dated Aug. 4, 2020; 9 pages.
U.S. Appl. No. 15/790,733; Non-Final Office Action; dated Mar. 30, 2021; 10 pages.
U.S. Appl. No. 15/790,733; Notice of Allowance; dated Jul. 28, 2021; 13 pages.

* cited by examiner

SUBSTRATE HOLDING APPARATUS, ELASTIC MEMBRANE, POLISHING APPARATUS, AND METHOD FOR REPLACING ELASTIC MEMBRANE

CROSS REFERENCE TO RELATED APPLICATIONS

This document claims priorities to U.S. Non-Provisional patent application Ser. No. 15/790,733, filed Oct. 23, 2017, Japanese Patent Application No. 2016-211585 filed Oct. 28, 2016 and Japanese Patent Application No. 2017-071392 filed Mar. 31, 2017, the entire contents of which are hereby incorporated by reference.

BACKGROUND

With a recent trend toward higher integration and higher density in semiconductor devices, circuit interconnects become finer and finer and the number of levels in multilayer interconnect is increasing. In the fabrication process of the multilayer interconnects with finer circuit, as the number of interconnect levels increases, film coverage (or step coverage) of step geometry is lowered in thin film formation because surface steps grow while following surface irregularities on a lower layer. Therefore, in order to fabricate the multilayer interconnects, it is necessary to improve the step coverage and planarize the surface. It is also necessary to planarize semiconductor device surfaces so that irregularity steps formed thereon fall within a depth of focus in optical lithography. This is because finer optical lithography entails shallower depth of focus.

Accordingly, the planarization of the semiconductor device surfaces is becoming more important in the fabrication process of the semiconductor devices. Chemical mechanical polishing (CMP) is the most important technique in the surface planarization. This chemical mechanical polishing is a process of polishing a wafer by bringing the wafer into sliding contact with a polishing surface of a polishing pad while supplying a polishing liquid containing abrasive grains, such as silica ($SiO_2$), onto the polishing surface.

A polishing apparatus for performing CMP has a polishing table that supports the polishing pad thereon, and a substrate holding apparatus, which is called a top ring or a polishing head, for holding a wafer. When the wafer is polished using such polishing apparatus, the substrate holding apparatus holds the wafer and presses it against the polishing surface of the polishing pad at a predetermined pressure. At this time, the polishing table and the substrate holding apparatus are moved relative to each other to bring the wafer into sliding contact with the polishing surface, thereby polishing a surface of the wafer.

During polishing of the wafer, if a relative pressing force applied between the wafer and the polishing surface of the polishing pad is not uniform over the entire surface of the wafer, insufficient polishing or excessive polishing would occur depending on a pressing force applied to each portion of the wafer. Thus, in order to make the pressing force against the wafer uniform, the substrate holding apparatus has a pressure chamber defined by an elastic membrane at a lower part thereof. This pressure chamber is supplied with a fluid, such as air, to press the wafer through the elastic membrane with a fluid pressure (for example, see Japanese Laid-open Patent Publication No. 2015-193070).

FIG. 22 is a cross-sectional view showing an example of a conventional elastic membrane. As shown in FIG. 22, a conventional elastic membrane 110 has a circular contact portion 111 that can be brought into contact with the substrate, and a plurality of circumferential walls 110a, 110b, 110c, 110d, 110e, 110f, 110g, and 110h (eight circumferential walls in FIG. 22) which are directly or indirectly coupled to the contact portion 111. Upper ends of the circumferential walls 110a to 110h are attached to a lower surface of a head body 102 by four holding rings 105, 106, 107, and 108. A plurality of pressure chambers (i.e., a circular central pressure chamber 116a located at a center of the elastic membrane, annular edge pressure chambers 116g, 116h located at the outermost part of the elastic membrane, and annular intermediate pressure chambers 116b, 116c, 116d, 116e, and 116f located between the central pressure chamber 116a and the edge pressure chambers 116g, 116h) are formed by the circumferential walls 110a to 110h. The circumferential wall 110h is an outermost circumferential wall, and is referred to as an edge circumferential wall 110h. Further, the circumferential walls 110a to 110g are located radially inwardly of the edge circumferential wall 110h, and are referred to as inner circumferential walls 110a to 110g. By adjusting pressures of the pressurized fluid supplied to the respective pressure chambers, respectively, pressing forces applied to the substrate can be adjusted at respective zones of the substrate. Therefore, polishing profile can be adjusted precisely over the entire surface of the substrate, and thus the entire surface of the substrate can be polished uniformly.

However, the inner circumferential walls of the conventional elastic membrane have slope portions inclined radially inwardly, and horizontal portions connected to the slope portions. For example, the inner circumferential walls 110a to 110f of the elastic membrane 110 shown in FIG. 22 have slope portions 120a to 120f inclined radially inwardly from contact portions 111, and horizontal portions 121a to 121f extending horizontally from the slope portions 120a to 120f, respectively. The inner circumferential wall 110g has a horizontal portion 121g extending horizontally from the edge circumferential wall 110h, and a slope portion 120g connected to the horizontal portion 121g. In the case where the plural pressure chambers 116a to 116h are formed by the inner circumferential walls 110a to 110g having the slope portions and the horizontal portions, and the edge circumferential wall 110h, the inner circumferential walls 110a to 110g are deformed by the pressure difference between pressures of fluid supplied respectively to the adjacent pressure chambers. For example, if the pressure of fluid supplied to the pressure chamber 116e is higher than the pressure of fluid supplied to the pressure chamber 116d, the inner circumferential wall 110d is inflated toward the contact portion 111. If the pressure difference between the pressure of fluid in the pressure chamber 116e and the pressure of fluid in the pressure chamber 116d becomes large to some extent, the horizontal portion 121d of the inner circumferential wall 110d is forcibly brought into contact with the contact portion 111. In this case, the horizontal portion 121d of the inner circumferential wall 110d presses the contact portion 111 against the substrate, and thus a polishing rate of the contact portion between the horizontal portion 121d and the contact portion 111 is increased. Therefore, in the conventional substrate holding apparatus, an allowable value is set for the pressure difference of fluid supplied respectively to the adjacent pressure chambers, and therefore there is a certain limit to precise adjustment of the polishing profile.

Further, in recent years, there has been a demand for a polishing apparatus which can precisely adjust polishing profile of a substrate, particularly, polishing profile of a peripheral portion of the substrate. Therefore, as shown in FIG. 22, the distance between the inner circumferential walls at the peripheral portion of the elastic membrane 110 is made smaller than the distance between the circumferential walls at the central portion of the elastic membrane 110, thereby making the width of the pressure chamber positioned radially outwardly of the substrate smaller. For example, the distance between the inner circumferential wall 110f and the inner circumferential wall 110g is smaller than the distance between the inner circumferential wall 110c and the inner circumferential wall 110d, and thus the width of the pressure chamber 116g in a radial direction is smaller than the width of the pressure chamber 116d in the radial direction. If the width of the pressure chamber formed by the circumferential walls having the slope portions and the horizontal portions is made further smaller, as shown by the inner circumferential wall 110f and the inner circumferential wall 110g of FIG. 22, the circumferential walls are required to be arranged one above the other in the vertical direction. In this case, when the pressure difference between the pressure of fluid in the pressure chamber 116h and the pressure of fluid in the pressure chamber 116g becomes large to some extent, the inner circumferential wall 110g is liable to be brought into contact with the inner circumferential wall 110f. In view of the possibility of the contact between the adjacent inner circumferential walls, in the conventional substrate holding apparatus, there is a certain limit to precise adjustment of the polishing profile, particularly the polishing profile of the peripheral portion of the substrate.

Further, there is a limit to make the width of the pressure chamber smaller by using the conventional elastic membrane 110. More specifically, because the inner circumferential wall has the horizontal portion, it is necessary to form a certain distance between the adjacent inner circumferential walls so that the adjacent inner circumferential walls are not brought into contact with each other. As a result, in order to adjust the polishing profile of the substrate precisely, it may be occasionally difficult to make the width of the pressure chamber in a radial direction smaller.

SUMMARY OF THE INVENTION

According to an embodiment, there is provided a substrate holding apparatus which can adjust polishing profile precisely. Further, according to embodiments, there are provided an elastic membrane for use in such substrate holding apparatus and a polishing apparatus having such substrate holding apparatus. Furthermore, according to an embodiment, there is provided a method for replacing such elastic membrane.

Embodiments, which will be described below, relate to a substrate holding apparatus for holding a substrate such as a wafer. Further, the below-described embodiments relate to an elastic membrane for use in the substrate holding apparatus, and a polishing apparatus having the substrate holding apparatus. Furthermore, the below-described embodiments relate to a method for replacing the elastic membrane.

In an embodiment, there is provided a substrate holding apparatus comprising: an elastic membrane that forms a plurality of pressure chambers for pressing a substrate; and a head body to which the elastic membrane is coupled; wherein the elastic membrane comprises: a contact portion to be brought into contact with the substrate for pressing the substrate against a polishing pad; an edge circumferential wall extending upwardly from a peripheral edge of the contact portion; and a plurality of inner circumferential walls arranged radially inwardly of the edge circumferential wall and extending upwardly from the contact portion; wherein at least two adjacent inner circumferential walls of the plurality of inner circumferential walls comprise slope circumferential walls inclined radially inwardly; and the slope circumferential walls are inclined radially inwardly in their entirety from their lower ends to upper ends, and extend upwardly.

In an embodiment, the slope circumferential walls extend substantially parallel to each other.

In an embodiment, one of the slope circumferential walls is arranged adjacent to the edge circumferential wall.

In an embodiment, the head body comprises at least one coupling ring to which the elastic membrane is coupled; the coupling ring comprises a ring vertical portion and a ring slope portion which is inclined radially outwardly from the ring vertical portion and extends downwardly; and the ring slope portion has an inner circumferential surface and an outer circumferential surface to limit a deformation of the slope circumferential wall.

In an embodiment, a tip end of the ring slope portion is positioned below an intermediate point of the slope circumferential wall.

In an embodiment, a seal groove is formed in an outer circumferential wall of the ring slope portion and extends over an entire circumference of the outer circumferential surface of the ring slope portion; an upper end of the slope circumferential wall comprises a seal projection configured to be fitted into the seal groove; and the seal projection is pressed against the seal groove to seal a gap between the coupling ring and the slope circumferential wall.

In an embodiment, the substrate holding apparatus further comprises fixing members configured to fix the two slope circumferential walls to the three coupling rings simultaneously; wherein the fixing member has a fixing member body and an elliptically shaped flange projecting outwardly of the fixing member body; the three coupling rings comprises an inner-side coupling ring, an outer-side coupling ring, and an intermediate coupling ring sandwiched between the inner-side coupling ring and the outer-side coupling ring and held by the inner-side coupling ring and the outer-side coupling ring; and an inner-side engagement groove and an outer-side engagement groove are formed in the ring vertical portion of the inner-side coupling ring and the ring vertical portion of the outer-side coupling ring, respectively, the flange of the fixing member being engageable with the inner-side engagement groove and the outer-side engagement groove.

In an embodiment, the substrate holding apparatus further comprises a positioning mechanism configured to fix relative positions between the inner-side coupling ring, the outer-side coupling ring and the intermediate coupling ring.

In an embodiment, the positioning mechanism comprises: a rod-like member; a first insertion hole formed in the ring vertical portion of the inner-side coupling ring and configured to allow the rod-like member to be inserted; a second insertion hole formed in the ring vertical portion of the intermediate coupling ring and configured to allow the rod-like member to be inserted; and a third insertion hole formed in the ring vertical portion of the outer-side coupling ring and configured to allow the rod-like member to be inserted.

In an embodiment, the positioning mechanism comprises: a first engagement projection projecting from an inner circumferential surface of the ring vertical portion of the intermediate coupling ring or an outer circumferential surface of the ring vertical portion of the inner-side coupling ring; a first engagement recess formed in the outer circumferential surface of the ring vertical portion of the inner-side coupling ring or the inner circumferential surface of the ring vertical portion of the intermediate coupling ring and being engageable with the first engagement projection; a second engagement projection projecting from the outer circumferential surface of the ring vertical portion of the intermediate coupling ring or the inner circumferential surface of the ring vertical portion of the outer-side coupling ring; and a second engagement recess formed in the inner circumferential surface of the ring vertical portion of the outer-side coupling ring or the outer circumferential surface of the ring vertical portion of the intermediate coupling ring and being engageable with the second engagement projection.

In an embodiment, the first engagement projection and the second engagement projection are formed on the inner circumferential surface and the outer circumferential surface of the ring vertical portion of the intermediate coupling ring, respectively; the first engagement recess is formed in the outer circumferential surface of the ring vertical portion of the inner-side coupling ring; and the second engagement recess is formed in the inner circumferential surface of the ring vertical portion of the outer-side coupling ring.

In an embodiment, the positioning mechanism comprises: a position alignment member fixed to a lower surface of the head body and having a flange portion formed at an upper end portion thereof and an engagement projection formed at a lower end portion thereof; an inner-side step portion formed on the outer circumferential surface of the ring vertical portion of the inner-side coupling ring and being engaged with the flange portion of the position alignment member; an outer-side step portion formed on the inner circumferential surface of the ring vertical portion of the outer-side coupling ring and being engaged with the flange portion of the position alignment member; and an engagement recess formed in an upper surface of the ring vertical portion of the intermediate coupling ring and being engaged with the engagement projection of the position alignment member.

In an embodiment, there is provided an elastic membrane for use in a substrate holding apparatus, comprising: a contact portion to be brought into contact with a substrate for pressing the substrate against a polishing pad; an edge circumferential wall extending upwardly from a peripheral edge of the contact portion; and a plurality of inner circumferential walls arranged radially inwardly of the edge circumferential wall and extending upwardly from the contact portion: wherein at least two adjacent inner circumferential walls of the plurality of inner circumferential walls comprise slope circumferential walls inclined radially inwardly; and the slope circumferential walls are inclined radially inwardly in their entirety from their lower ends to upper ends, and extend upwardly.

In an embodiment, there is provided a polishing apparatus comprising: a polishing table for supporting a polishing pad; and a substrate holding apparatus configured to press a substrate against the polishing pad; the substrate holding apparatus comprising an elastic membrane that forms a plurality of pressure chambers for pressing the substrate, and a head body to which the elastic membrane is coupled; wherein the elastic membrane comprises: a contact portion to be brought into contact with the substrate for pressing the substrate against the polishing pad; an edge circumferential wall extending upwardly from a peripheral edge of the contact portion; and a plurality of inner circumferential walls arranged radially inwardly of the edge circumferential wall and extending upwardly from the contact portion; wherein at least two adjacent inner circumferential walls of the plurality of inner circumferential walls comprise slope circumferential walls inclined radially inwardly; and the slope circumferential walls are inclined radially inwardly in their entirety from their lower ends to upper ends, and extend upwardly.

In an embodiment, there is provided a method for replacing an elastic membrane that is fixed to a head body of a substrate holding apparatus and forms a plurality of pressure chambers for pressing a substrate; the elastic membrane comprising: a contact portion to be brought into contact with the substrate for pressing the substrate against a polishing pad; an edge circumferential wall extending upwardly from a peripheral edge of the contact portion; and a plurality of inner circumferential walls arranged radially inwardly of the edge circumferential wall and extending upwardly from the contact portion; at least two adjacent inner circumferential walls of the plurality of inner circumferential walls comprising slope circumferential walls inclined radially inwardly; and the slope circumferential walls being inclined radially inwardly in their entirety from their lower ends to upper ends, and extending upwardly: the head body comprising: at least three coupling rings to which the elastic membrane is coupled, the at least two slope circumferential walls being coupled to the at least three coupling rings by fixing members; the fixing member comprising: a fixing member body; and a flange projecting from the fixing member body and being engageable with an inner-side coupling ring and an outer-side coupling ring of the at least three coupling rings; the method comprising: disengaging the flange from the inner-side coupling ring and the outer-side coupling ring; removing the elastic membrane from the at least three coupling rings; preparing a new elastic membrane; making the at least three coupling rings hold at least two slope circumferential walls of the new elastic membrane; and making the flange of the fixing member engage with the inner-side coupling ring and the outer-side coupling ring to fix the new elastic membrane to the head body.

According to the above-described embodiments, the inner circumferential walls configured as the slope circumferential walls are inclined radially inwardly in their entirety from their lower ends to upper ends, and extend upwardly. Specifically, the slope circumferential walls have no horizontal portions. Therefore, even if the pressure difference between the pressures of fluid supplied respectively to the adjacent pressure chambers is large, the slope circumferential walls are not brought into contact with the contact portion. Further, the adjacent slope circumferential walls can be prevented from being brought into contact with each other. Furthermore, because the distance between the adjacent slope circumferential walls can be made small, the width of the pressure chamber in a radial direction can be made small. As a result, the polishing profile of the substrate held by the substrate holding apparatus can be precisely adjusted.

DESCRIPTION OF THE EMBODIMENTS

Figure 1:
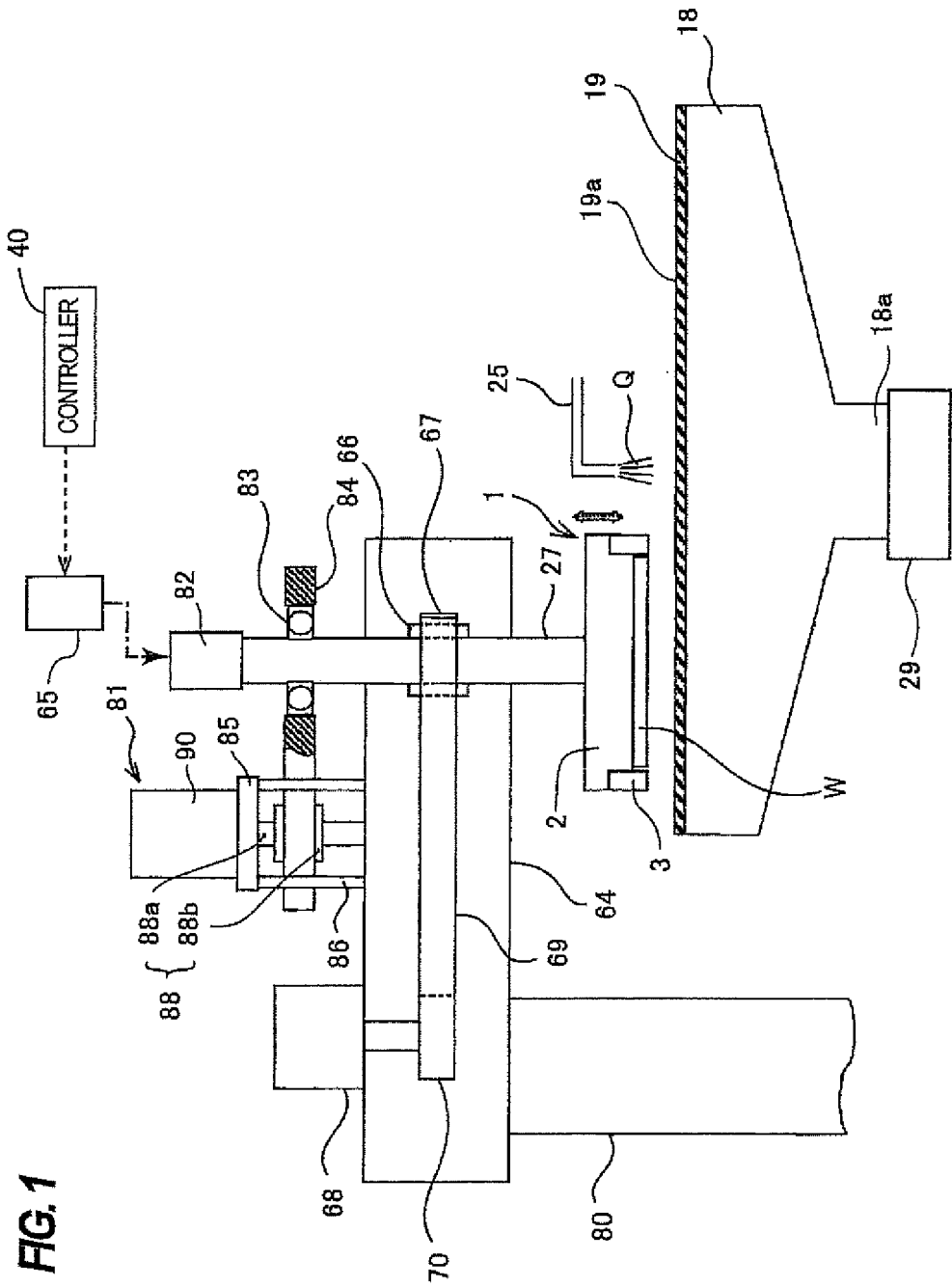
FIG. 1 is a view showing a polishing apparatus according to an embodiment.

Embodiments will be described below with reference to the drawings. FIG. 1 is a view showing a polishing apparatus according to an embodiment. As shown in FIG. 1, the polishing apparatus includes a polishing table 18 for supporting a polishing pad 19, and a substrate holding apparatus 1 for holding a wafer W as an example of a substrate, which is an object to be polished, and pressing the wafer W against the polishing pad 19 on the polishing table 18. In the following description, the substrate holding apparatus 1 is referred to as a polishing head 1.

The polishing table 18 is coupled via a table shaft 18a to a table motor 29 disposed below the polishing table 18, so that the polishing table 18 is rotatable about the table shaft 18a. The polishing pad 19 is attached to an upper surface of the polishing table 18. A surface 19a of the polishing pad 19 serves as a polishing surface for polishing the wafer W. A polishing liquid supply nozzle 25 is provided above the polishing table 18 so that the polishing liquid supply nozzle 25 supplies a polishing liquid Q onto the polishing pad 19 on the polishing table 18.

The polishing head 1 includes a head body 2 for pressing the wafer W against the polishing surface 19a, and a retaining ring 3 for retaining the wafer W therein so as to prevent the wafer W from slipping out of the polishing head 1. The polishing head 1 is coupled to a head shaft 27, which is vertically movable relative to a head arm 64 by a vertically moving mechanism 81. This vertical movement of the head shaft 27 causes the entirety of the polishing head 1 to move vertically relative to the head arm 64 and enables positioning of the polishing head 1. A rotary joint 82 is mounted to an upper end of the head shaft 27.

The vertically moving mechanism 81 for elevating and lowering the head shaft 27 and the polishing head 1 includes a bridge 84 that rotatably supports the head shaft 27 through a bearing 83, a ball screw 88 mounted to the bridge 84, a support pedestal 85 supported by support posts 86, and a servomotor 90 mounted to the support pedestal 85. The support pedestal 85, which supports the servomotor 90, is fixedly mounted to the head arm 64 through the support posts 86.

The ball screw 88 includes a screw shaft 88a coupled to the servomotor 90 and a nut 88b that engages with the screw shaft 88a. The head shaft 27 is vertically movable together with the bridge 84. When the servomotor 90 is set in motion, the bridge 84 moves vertically through the ball screw 88, so that the head shaft 27 and the polishing head 1 move vertically.

The head shaft 27 is coupled to a rotary sleeve 66 by a key (not shown). A timing pulley 67 is secured to an outer circumferential portion of the rotary sleeve 66. A head motor 68 is fixed to the head arm 64. The timing pulley 67 is coupled through a timing belt 69 to a timing pulley 70, which is mounted to the head motor 68. When the head motor 68 is set in motion, the rotary sleeve 66 and the head shaft 27 are rotated integrally through the timing pulley 70, the timing belt 69, and the timing pulley 67, thus rotating the polishing head 1. The head arm 64 is supported by an arm shaft 80, which is rotatably supported by a frame (not shown). The polishing apparatus includes a controller 40 for controlling respective devices provided in the apparatus including the head motor 68 and the servomotor 90.

The polishing head 1 is configured to be able to hold the wafer W on its lower surface. The head arm 64 is configured to be able to pivot on the arm shaft 80. Thus, the polishing head 1, which holds the wafer W on its lower surface, is moved from a position at which the polishing head 1 receives the wafer W to a position above the polishing table 18 by a pivotal movement of the head arm 64.

Polishing of the wafer W is performed as follows. The polishing head 1 and the polishing table 18 are rotated individually, while the polishing liquid Q is supplied from the polishing liquid supply nozzle 25, provided above the polishing table 18, onto the polishing pad 19. In this state, the polishing head 1 is lowered to a predetermined position (i.e., a predetermined height) and then presses the wafer W against the polishing surface 19a of the polishing pad 19. The wafer W is placed in sliding contact with the polishing surface 19a of the polishing pad 19, so that a surface of the wafer W is polished.

Figure 2:
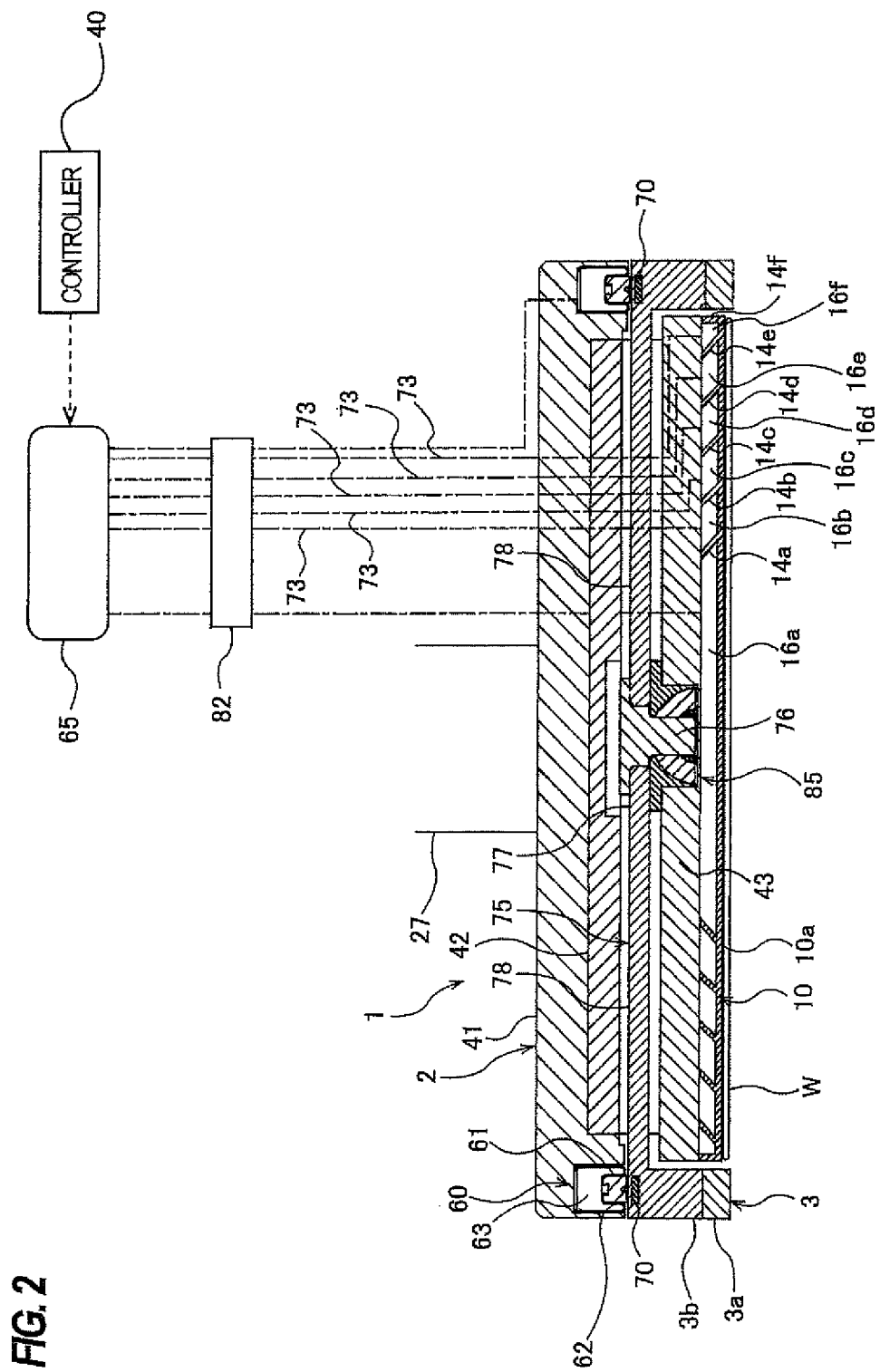
FIG. 2 is a schematic view showing a substrate holding apparatus provided in the polishing apparatus shown in FIG. 1.

Next, the polishing head 1 will be described. FIG. 2 is a schematic cross-sectional view of the polishing head (substrate holding apparatus) 1. As shown in FIG. 2, the polishing head 1 includes a head body 2 for pressing the wafer W against the polishing surface 19a, and a retaining ring 3 arranged so as to surround the wafer W. The head body 2 and the retaining ring 3 are rotatable in unison by the rotation of the head shaft 27. The retaining ring 3 is configured to be vertically movable independently of the head body 2.

The head body 2 has a circular flange 41, a spacer 42 mounted to a lower surface of the flange 41, and a carrier 43 mounted to a lower surface of the spacer 42. The flange 41 is coupled to the head shaft 27. The carrier 43 is coupled to the flange 41 through the spacer 42, so that the flange 41, the spacer 42, and the carrier 43 rotate and vertically move in unison. The head body 2 having the flange 41, the spacer 42 and the carrier 43 is made of resin such as engineering plastic (e.g., PEEK). The flange 41 may be made of metal such as SUS, aluminum, or the like.

An elastic membrane 10, which is brought into contact with a back surface of the wafer W, is attached to a lower surface of the head body 2. A method for attaching the elastic membrane 10 to the head body 2 will be described later. This elastic membrane 10 has a lower surface which serves as a substrate holding surface 10a. The elastic membrane 10 has a plurality of annular circumferential walls 14a, 14b, 14c, 14d, 14e, and 14f (six circumferential walls in FIG. 2), and these circumferential walls 14a to 14f are concentrically arranged. These annular circumferential walls 14a to 14f define six pressure chambers: a circular central pressure chamber 16a located at a center of the elastic membrane 10, an annular edge pressure chamber 16f located at the outermost part of the elastic membrane 10, and intermediate pressure chambers 16b, 16c, 16d and 16e located between the central pressure chamber 16a and the edge pressure chamber 16f. These pressure chambers 16a to 16f are in fluid communication with a pressure regulator 65 via the rotary joint 82, so that a fluid (e.g., air) is supplied into the respective pressure chambers 16a to 16f through respective fluid lines 73 extending to the respective pressure chambers 16a to 16f from the pressure regulator 65. The pressure regulator 65 is connected to a controller 40, so that pressures in the six pressure chambers 16a to 16f can be independently adjusted. Further, the pressure regulator 65 can create a negative pressure in the pressure chambers 16a to 16f. Thus, in the polishing head 1, pressing forces applied to the wafer W can be adjusted at respective zones of the wafer W by adjusting pressures of the fluid supplied to the respective pressure chambers 16a to 16f formed between the head body 2 and the elastic membrane 10.

The elastic membrane 10 is made of a highly strong and durable rubber material, such as ethylene propylene rubber (EPDM), polyurethane rubber, silicone rubber, or the like. The respective pressure chambers 16a to 16f are further coupled to a pressure relief mechanism (not shown), which can establish a fluid communication between the atmosphere and these pressure chambers 16a to 16f.

The retaining ring 3 is disposed so as to surround the carrier 43 of the head body 2 and the elastic membrane 10. This retaining ring 3 has a ring member 3a that contacts the polishing surface 19a of the polishing pad 19, and a drive ring 3b fixed to an upper portion of the ring member 3a. The ring member 3a is secured to the drive ring 3b by a plurality of bolts (not shown). The ring member 3a is arranged so as to surround a peripheral edge of the wafer W and retains the wafer W therein so as to prevent the wafer W from slipping out of the polishing head 1 when the wafer W is being polished.

The retaining ring 3 has an upper portion coupled to an annular retaining ring pressing mechanism 60, which is configured to exert a uniform downward load on an upper surface of the retaining ring 3 (more specifically, an upper surface of the drive ring 3b) in its entirety to thereby press a lower surface of the retaining ring 3 (i.e., a lower surface of the ring member 3a) against the polishing surface 19a of the polishing pad 19.

The retaining ring pressing mechanism 60 includes an annular piston 61 fixed to an upper portion of the drive ring 3b, and an annular rolling diaphragm 62 connected to an upper surface of the piston 61. The rolling diaphragm 62 defines a retaining ring pressure chamber 63 therein. This retaining ring pressure chamber 63 is in fluid communication with the pressure regulator 65 through the rotary joint 82. When the pressure regulator 65 supplies a fluid (e.g., air) into the retaining ring pressure chamber 63, the rolling diaphragm 62 pushes down the piston 61, which in turn pushes down the retaining ring 3 in its entirety. In this manner, the retaining ring pressing mechanism 60 presses the lower surface of the retaining ring 3 against the polishing surface 19a of the polishing pad 19. Further, when the pressure regulator 65 develops the negative pressure in the retaining ring pressure chamber 63, the retaining ring 3 in its entirety is elevated. The retaining ring pressure chamber 63 is further coupled to a pressure relief mechanism (not shown), which can establish a fluid communication between the atmosphere and the retaining ring pressure chamber 63.

The retaining ring 3 is removably coupled to the retaining ring pressing mechanism 60. More specifically, the piston 61 is made of a magnetic material such as metal, and a plurality of magnets 70 are disposed on the upper portion of the drive ring 3b. These magnets 70 magnetically attract the piston 61, so that the retaining ring 3 is secured to the piston 61 by a magnetic force. The magnetic material of the piston 61 may be corrosion resisting magnetic stainless steel. The drive ring 3b may be made of a magnetic material, and magnets may be disposed on the piston 61.

Figure 3:
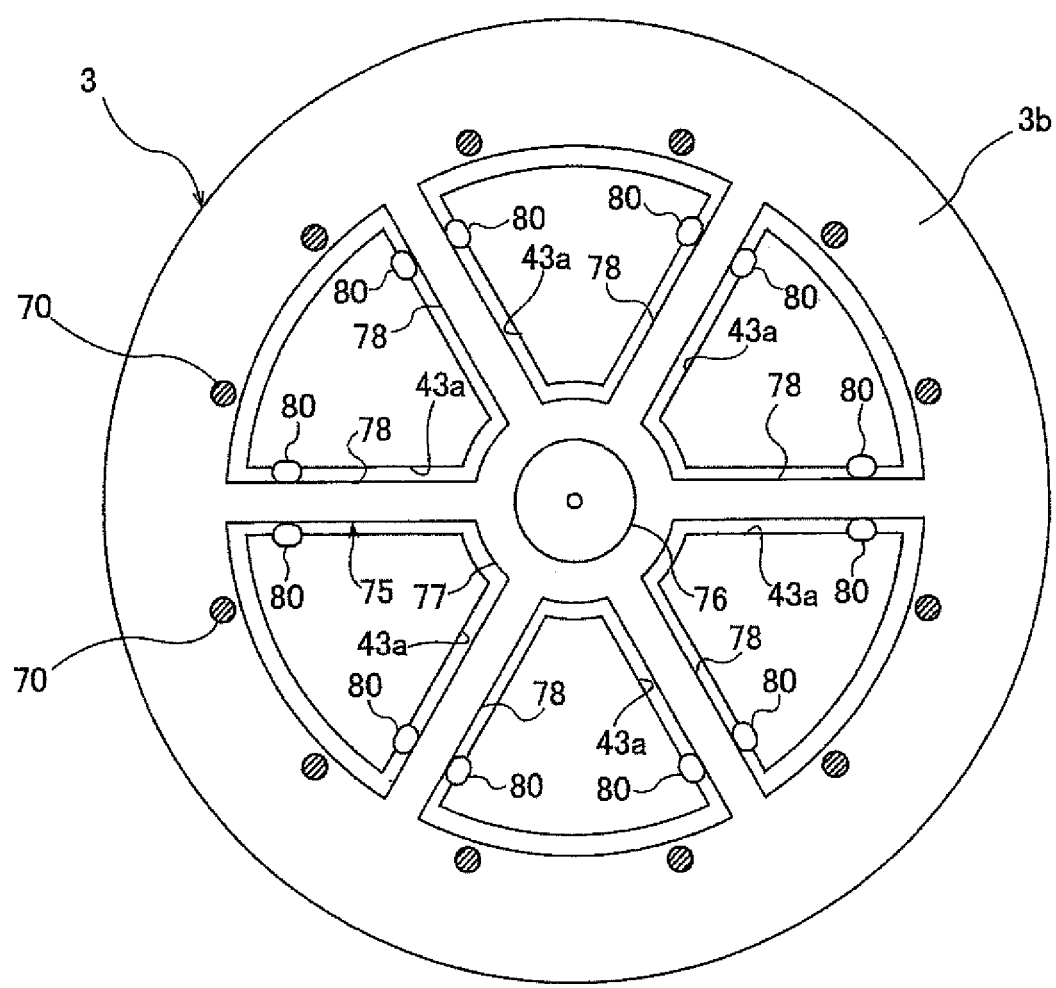
FIG. 3 is a plan view showing a retaining ring and a coupling member shown in FIG. 2.

The retaining ring 3 is coupled to a spherical bearing 85 through a coupling member 75. The spherical bearing 85 is disposed radially inwardly of the retaining ring 3. FIG. 3 is a plan view showing the retaining ring 3 and the coupling member 75. As shown in FIG. 3, the coupling member 75 includes a shaft portion 76 disposed centrally in the head body 2, a hub 77 secured to the shaft portion 76, and a plurality of spokes 78 (six spokes in the illustrated example) extending radially from the hub 77. The spokes 78 have one ends fixed to the hub 77 and the other ends fixed to the drive ring 3b of the retaining ring 3. In this embodiment, the hub 77, the spokes 78, and the drive ring 3b are formed integrally. Plural pairs of drive pins 80 and 80 are secured to the carrier 43. The drive pins 80 and 80 of each pair are arranged on both sides of each spoke 78. The rotation of the carrier 43 is transmitted to the retaining ring 3 through the drive pins 80 and 80 to thereby rotate the head body 2 and the retaining ring 3 in unison.

As shown in FIG. 2, the shaft portion 76 extends vertically in the spherical bearing 85. As shown in FIG. 3, the carrier 43 has a plurality of radial grooves 43a in which the spokes 78 are disposed, respectively. Each spoke 78 is movable freely in the vertical direction in each groove 43a. The shaft portion 76 of the coupling member 75 is supported by the spherical bearing 85 disposed in the central part of the head body 2 such that the shaft portion 76 is movable freely in the vertical direction. With this configuration, the coupling member 75 and the retaining ring 3 fixed to the coupling member 75 are vertically movable relative to the head body 2. Further, the retaining ring 3 is tiltably supported by the spherical bearing 85.

Figure 4:
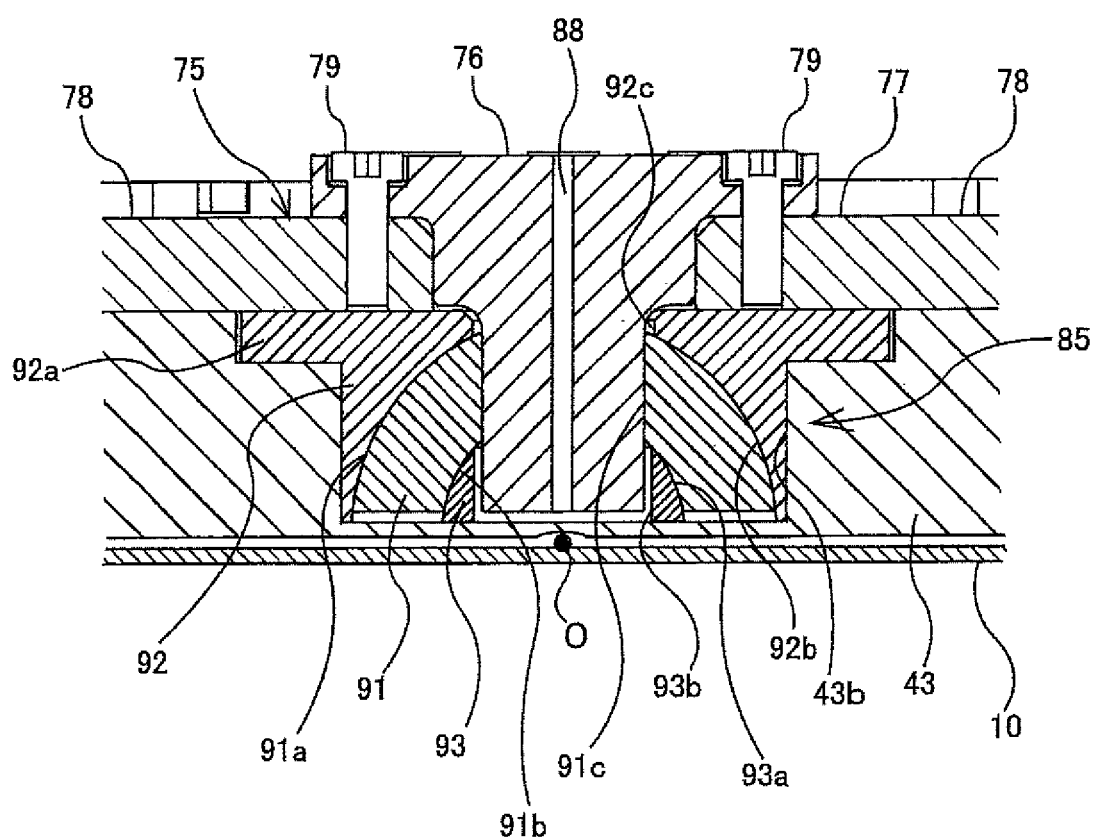
FIG. 4 is an enlarged cross-sectional view of a spherical bearing and a part of the coupling member shown in FIG. 2.

The spherical bearing 85 will now be described in more detail. FIG. 4 is an enlarged cross-sectional view of the spherical bearing 85 and a part of the coupling member 75. As shown in FIG. 4, the shaft portion 76 is secured to the hub 77 by a plurality of screws 79. The shaft portion 76 has a vertically extending through-hole 88 formed therein. This through-hole 88 acts as an air vent hole when the shaft portion 76 moves vertically relative to the spherical bearing 85. Therefore, the retaining ring 3 can move smoothly in the vertical direction relative to the head body 2.

The spherical bearing 85 includes an intermediate bearing ring 91 coupled to the retaining ring 3 through the coupling member 75, an outer bearing ring 92 slidably supporting the intermediate bearing ring 91 from above, and an inner bearing ring 93 slidably supporting the intermediate bearing ring 91 from below. The intermediate bearing ring 91 is in the form of a partial spherical shell smaller than an upper half of a spherical shell. The intermediate bearing ring 91 is sandwiched between the outer bearing ring 92 and the inner bearing ring 93.

The carrier 43 has a recess 43b formed at the central portion thereof, and the outer bearing ring 92 is disposed in this recess 43b. The outer bearing ring 92 has a flange portion 92a on its outer circumferential portion. The flange portion 92a is secured to a step of the recess 43b by bolts (not shown), thereby securing the outer bearing ring 92 to the carrier 43 and applying pressure to the intermediate bearing ring 91 and the inner bearing ring 93. The inner bearing ring 93 is disposed on a bottom surface of the recess 43b. This inner bearing ring 93 supports the intermediate bearing ring 91 from below so as to form a gap between a lower surface of the intermediate bearing ring 91 and the bottom surface of the recess 43b.

The outer bearing ring 92 has an inner surface 92b, the intermediate bearing ring 91 has an outer surface 91a and an inner surface 91b, and the inner bearing ring 93 has an outer surface 93a. Each of these surfaces 92b, 91a, 91b, and 93a comprises a substantially hemispheric surface whose center is represented by a fulcrum O. The outer surface 91a of the intermediate bearing ring 91 slidably contacts the inner surface 92b of the outer bearing ring 92. The inner surface 91b of the intermediate bearing ring 91 slidably contacts the outer surface 93a of the inner bearing ring 93. The inner surface 92b (sliding contact surface) of the outer bearing ring 92, the outer surface 91a and the inner surface 91b (sliding contact surfaces) of the intermediate bearing ring 91, and the outer surface 93a (sliding contact surface) of the inner bearing ring 93 have a partial spherical shape smaller than an upper half of a spherical surface. With these configurations, the intermediate bearing ring 91 is tiltable in all directions through 360° with respect to the outer bearing ring 92 and the inner bearing ring 93. The fulcrum O, which is the center of the tilting movement of the intermediate bearing ring 91, is located below the spherical bearing 85.

The outer bearing ring 92, the intermediate bearing ring 91, and the inner bearing ring 93 have respective through-holes 92c, 91c, and 93b formed therein in which the shaft portion 76 is inserted. There is a gap between the through-hole 92c of the outer bearing ring 92 and the shaft portion 76. Similarly, there is a gap between the through-hole 93b of the inner bearing ring 93 and the shaft portion 76. The through-hole 91c of the intermediate bearing ring 91 has a diameter smaller than those of the through-holes 92c and 93b of the outer bearing ring 92 and the inner bearing ring 93 such that the shaft portion 76 is movable relative to the intermediate bearing ring 91 only in the vertical direction. Therefore, the retaining ring 3, which is coupled to the shaft portion 76, is substantially not allowed to move laterally, i.e., horizontally. That is, the retaining ring 3 is fixed in its lateral position (i.e., its horizontal position) by the spherical bearing 85.

The spherical bearing 85 allows the retaining ring 3 to move vertically and tilt, while restricting the lateral movement (i.e., the horizontal movement) of the retaining ring 3. During polishing of the wafer W, the retaining ring 3 receives a lateral force from the wafer W (i.e., a force in a radially outward direction of the wafer W). This lateral force is generated due to friction between the wafer W and the polishing pad 19. The lateral force is received by the spherical bearing 85. Therefore, the spherical bearing 85 serves as a supporting mechanism capable of supporting the lateral force (i.e., the force in the radially outward direction of the wafer W) applied to the retaining ring 3 from the wafer W due to the friction between the wafer W and the polishing pad 19 and capable of restricting the lateral movement of the retaining ring 3 (i.e., capable of fixing the horizontal position of the retaining ring 3).

Figure 5:
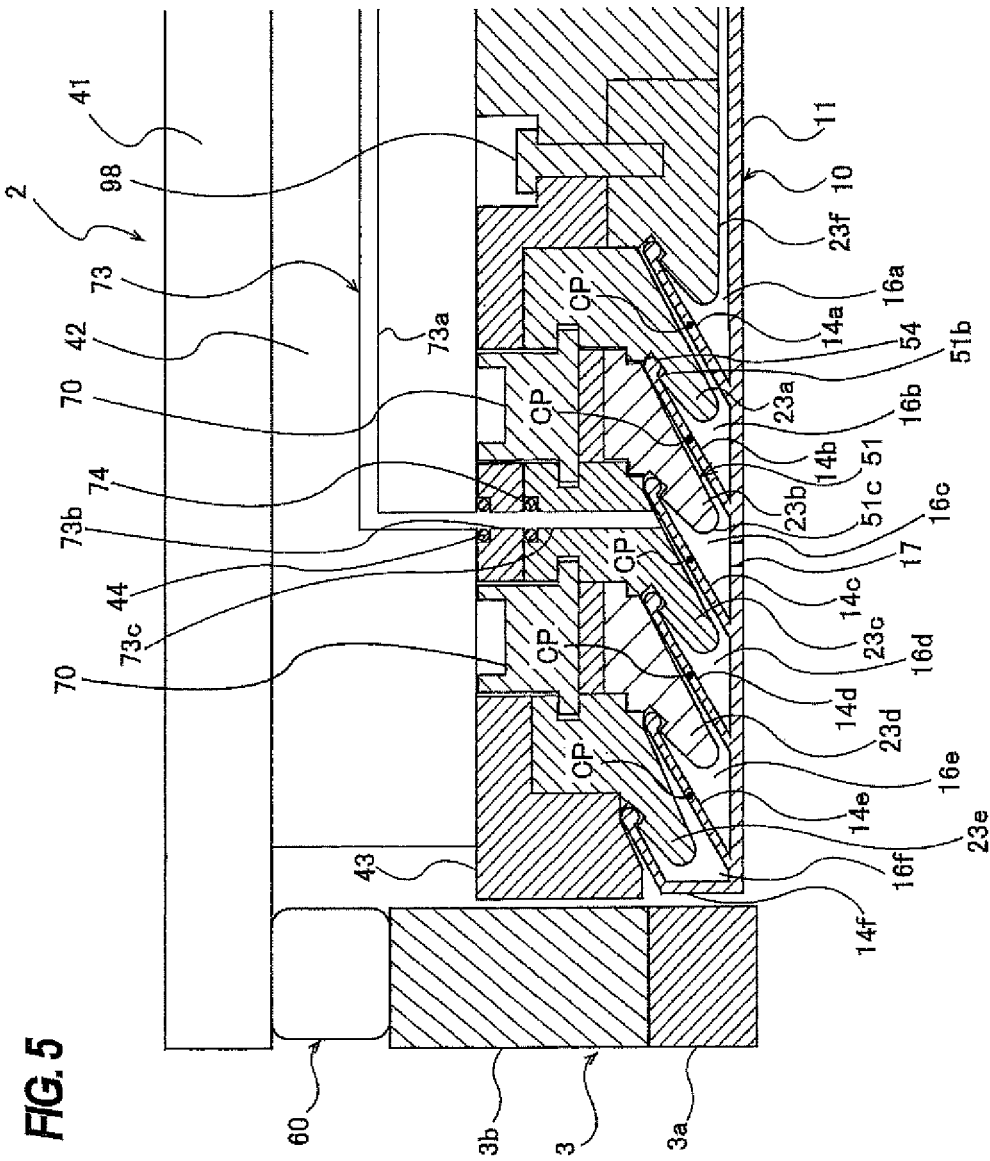
FIG. 5 is a schematic cross-sectional view showing the state in which an elastic membrane is coupled to a carrier of a head body according to an embodiment.
Figure 6:
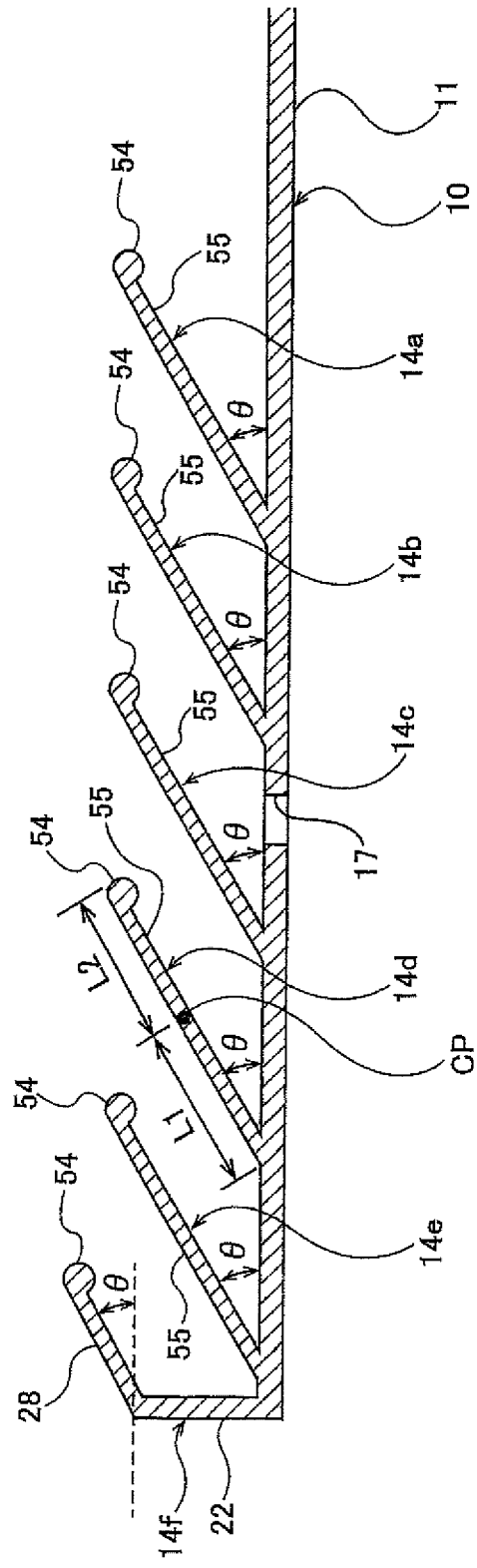
FIG. 6 is an enlarged cross-sectional view showing part of the elastic membrane shown in FIG. 5.

FIG. 5 is a schematic cross-sectional view showing the state in which the elastic membrane 10 is coupled to the head body 2. FIG. 6 is an enlarged cross-sectional view showing part of the elastic membrane 10 shown in FIG. 5. The elastic membrane 10 has a circular contact portion 11 which can be brought into contact with the wafer W, and a plurality of circumferential walls 14a, 14b, 14c, 14d, 14e, and 14f (six circumferential walls in FIG. 5) which are coupled to the contact portion 11. As described above, the six pressure chambers (the central pressure chamber 16a, the intermediate pressure chambers 16b to 16e, and the edge pressure chamber 16f) are formed by these six circumferential walls 14a to 14f. The contact portion 11 is brought into contact with a rear surface of the wafer W, which is a surface at an opposite side of the surface to be polished, to press the wafer W against the polishing pad 19. The circumferential walls 14a to 14f are annular circumferential walls which are concentrically arranged.

The circumferential wall 14f is an outermost circumferential wall and extends upwardly from a circumferential edge portion of the contact portion 11. In the following description, the circumferential wall 14f is referred to as an edge circumferential wall 14f. The circumferential wall 14e is arranged radially inwardly of the edge circumferential wall 14f, and the circumferential wall 14d is arranged radially inwardly of the circumferential wall 14e. The circumferential wall 14c is arranged radially inwardly of the circumferential wall 14d, the circumferential wall 14b is arranged radially inwardly of the circumferential wall 14c, and the circumferential wall 14a is arranged radially inwardly of the circumferential wall 14b. In the following description, the circumferential wall 14a is referred to as a first inner circumferential wall 14a, the circumferential wall 14b is referred to as a second inner circumferential wall 14b, and the circumferential wall 14c is referred to as a third inner circumferential wall 14c. The circumferential wall 14d is referred to as a fourth inner circumferential wall 14d, and the circumferential wall 14e is referred to as a fifth inner circumferential wall 14e. The inner circumferential walls 14a to 14e extend upwardly from the contact portion 11.

The contact portion 11 has a plurality of through-holes 17 communicating with the pressure chamber 16c formed between the second inner circumferential wall 14b and the third inner circumferential wall 14c. Only one through-hole 17 is shown in FIGS. 5 and 6. When a vacuum is created in the intermediate pressure chamber 16c in a state where the wafer W is brought in contact with the contact portion 11, the wafer W is held on a lower surface of the contact portion 11, i.e., the polishing head 1 by a vacuum suction. Further, when the fluid is supplied into the intermediate pressure chamber 16c in a state where the wafer W is separated from the polishing pad 19, the wafer W is released from the polishing head 1. The through-holes 17 may be formed at one of other pressure chambers, instead of the intermediate pressure chamber 16c. In such case, the vacuum suction of the wafer W and the release of the wafer W are performed by controlling the pressure in the pressure chamber at which the through-holes 17 are formed.

In the present embodiment, the inner circumferential walls 14a to 14e are configured as slope circumferential walls which are inclined radially inwardly, and have the same shape. The inner circumferential wall 14b configured as the slope circumferential wall will be described below.

The inner circumferential wall 14b as the slope circumferential wall has a circumferential wall body 55 extending obliquely upwardly from the contact portion 11, and an annular seal projection 54 formed at a distal end of the circumferential wall body 55. In the present embodiment, the seal projection 54 has a circular cross-sectional shape, and the circumferential wall body 55 extends in a tangential direction to the seal projection 54. The inner circumferential wall 14b is inclined radially inwardly in its entirety from its lower end to its upper end at a predetermined angle θ, and extends upwardly. The lower end of the inner circumferential wall 14b is connected to the contact portion 11, and the upper end (i.e., the seal projection 54) of the inner circumferential wall 14b is connected to a coupling ring 23a of the head body 2 (described later).

The inclination angle θ of the inner circumferential wall 14b with respect to the contact portion 11 is set preferably in the range of 20° to 70°. If the inclination angle θ is smaller than 20°, the inner circumferential wall 14b is liable to cause the same problem as the conventional inner circumferential wall having the horizontal portion (see the horizontal portions 121a to 121g in FIG. 22). More specifically, if the inclination angle θ is smaller than 20°, when the pressure difference of the fluid supplied to the adjacent pressure chambers 16 is large, the adjacent inner circumferential walls 14 are liable to be brought into contact with each other. If the inclination angle θ is larger than 70°, expansion and contraction of the elastic membrane 10 (i.e., deformation of the elastic membrane 10) in a vertical direction is liable to be inhibited by the inner circumferential walls 14. In this case, the elastic membrane 10 cannot be expanded or contracted properly according to the pressures of the fluid supplied to the pressure chambers 16, and thus it is liable to be difficult to adjust the pressing forces applied to the wafer W at respective zones of the wafer W.

As shown in FIG. 6, because the inner circumferential walls 14a to 14e configured as the slope circumferential wall have the same shape, the inner circumferential walls 14a to 14e extend parallel to one another. More particularly, the circumferential wall bodies 55 of the inner circumferential walls 14a to 14e are arranged parallel to one another. As shown in FIG. 5, a pressure chamber 16b is formed between the first inner circumferential wall 14a and the second inner circumferential wall 14b, a pressure chamber 16c is formed between the second inner circumferential wall 14b and the third inner circumferential wall 14c, and a pressure chamber 16d is formed between the third inner circumferential wall 14c and the fourth inner circumferential wall 14d. A pressure chamber 16e is formed between the fourth inner circumferential wall 14d and the fifth inner circumferential wall 14e, and a pressure chamber 16f is formed between the fifth inner circumferential wall 14e and the edge circumferential wall 14f. Although the inner circumferential walls 14a to 14e as the slope circumferential walls extend linearly in an obliquely upward direction in the present embodiment, the inner circumferential walls 14a to 14e may extend curvilinearly in an obliquely upward direction.

Further, in the elastic membrane 10 shown in FIGS. 5 and 6, the inner circumferential walls 14a to 14e configured as the slope circumferential walls extend parallel to one another. Specifically, the circumferential wall bodies 55 of the inner circumferential walls 14a to 14e have the same inclination angle θ. In this case, the adjacent inner circumferential walls 14 can be arranged at extremely narrow intervals, and thus the width of each of the pressure chambers 16 in a radial direction can be extremely narrowed.

If the inner circumferential walls 14a to 14e configured as the slope circumferential walls are not brought into contact with each other, the inner circumferential walls 14a to 14e may extend substantially parallel to one another. More specifically, the inclination angles θ of the circumferential wall bodies 55 of the inner circumferential walls 14a to 14e configured as the slope circumferential walls may be different from one another to some extent. In the present specification, the expression of "substantially parallel" means that when an inclination angle of one of the inner circumferential walls 14 configured as the slope circumferential walls is used as a standard (for convenience of explanation, this inclination angle is referred to as a standard inclination angle θs), the inclination angles θ of other inner circumferential walls 14 configured as the slope circumferential walls fall within ±10° with respect to the standard inclination angle θs (i.e., θs−10≤θ≤θs+10). For example, in the case where the inclination angle of the inner circumferential wall 14a is 45° and is the standard inclination angle θs, the inclination angles θ of the inner circumferential walls 14b to 14e fall within ±10° with respect to the standard inclination angle θs (=45°) of the inner circumferential wall 14a (i.e., in the range of 35° to 55°).

In the present embodiment, the edge circumferential wall 14f comprises a vertical portion 22 extending vertically with respect to the contact portion 11, and a slope portion 28 coupled to the vertical portion 22. The slope portion 28 extends radially inwardly from the vertical portion 22. The inclination angle of the slope portion 28 with respect to the contact portion 11 is the same as the inclination angle θ of the inner circumferential walls 14a to 14e. Although not shown in the drawing, the edge circumferential wall 14f may extend vertically from the contact portion 11 to the head body 2.

The elastic membrane 10 having the inner circumferential walls 14a to 14e, the edge circumferential wall 14f and the contact portion 11 can be formed integrally using a mold or the like.

As described above, the fluid is supplied to the respective pressure chambers 16a to 16f through the fluid lines 73 (see FIGS. 1 and 2) extending from the pressure regulator 65 via the rotary joint 82. In FIG. 5, only part of the fluid line 73 for supplying the fluid from the pressure regulator 65 to the pressure chamber 16d is shown.

The part of the fluid line 73 shown in FIG. 5 comprises a through-hole 73a formed in the spacer 42, a through-hole 73b formed in the carrier 43 and communicating with the through-hole 73a, and a through-hole 73c formed in the coupling ring 23 (described later) and communicating with the through-hole 73b. These through-holes 73a, 73b, and 73c have the same diameter. An annular recess is formed at the upper end of the through-hole 73c formed in the coupling ring 23, and a seal member (e. g., O-ring) 74 for sealing a gap between the coupling ring 23 and the carrier 43 is provided in the recess. The seal member 74 prevents the fluid flowing in the through-holes 73b and 73c from leaking through the gap between the coupling ring 23 and the carrier 43. Similarly, an annular recess is formed at the upper end of the through-hole 73b formed in the carrier 43, and a seal member (e. g., O-ring) 44 for sealing a gap between the carrier 43 and the spacer 42 is provided in the recess. The seal member 44 prevents the fluid flowing in the through-holes 73a and 73b from leaking through the gap between the spacer 42 and the carrier 43.

Further, the head body 2 has a plurality of coupling rings 23a to 23e to which the inner circumferential walls 14a to 14e and the edge circumferential wall 14f are coupled. The coupling ring 23a is arranged between the first inner circumferential wall 14a and the second inner circumferential wall 14b, and is referred to as a first coupling ring 23a in the following description. The coupling ring 23b is arranged between the second inner circumferential wall 14b and the third inner circumferential wall 14c, and is referred to as a second coupling ring 23b in the following description. The coupling ring 23c is arranged between the third inner circumferential wall 14c and the fourth inner circumferential wall 14d, and is referred to as a third coupling ring 23c in the following description. The coupling ring 23d is arranged between the fourth inner circumferential wall 14d and the fifth inner circumferential wall 14e, and is referred to as a fourth coupling ring 23d in the following description. The coupling ring 23e is arranged between the fifth inner circumferential wall 14e and the edge circumferential wall 14f, and is referred to as a fifth coupling ring 23e in the following description. In this manner, each of the coupling rings 23a to 23e is arranged between the adjacent inner circumferential walls 14. In the present embodiment, because the first inner circumferential wall 14a is configured as the slope circumferential wall, the head body 2 has a coupling ring 23f to which the inner circumferential wall 14a is coupled. In the following description, the coupling ring 23f is referred to as an additional coupling ring 23f.

The first coupling ring 23a, the third coupling ring 23c and the fifth coupling ring 23e have the same configuration except for engagement grooves, step portions and projecting portions (described later). The second coupling ring 23b and the fourth coupling ring 23d have the same configuration. Further, the second coupling ring 23b and the fourth coupling ring 23d are different from the first coupling ring 23a, the third coupling ring 23c and the fifth coupling ring 23e in that ring vertical portions (described later) of the second coupling ring 23b and the fourth coupling ring 23d are shorter than ring vertical portions of the first coupling ring 23a, the third coupling ring 23c and the fifth coupling ring 23e, and engagement grooves are not formed in the ring vertical portions of the second coupling ring 23b and the fourth coupling ring 23d. The configuration of the third coupling ring 23c will be described below.

Figure 7A:
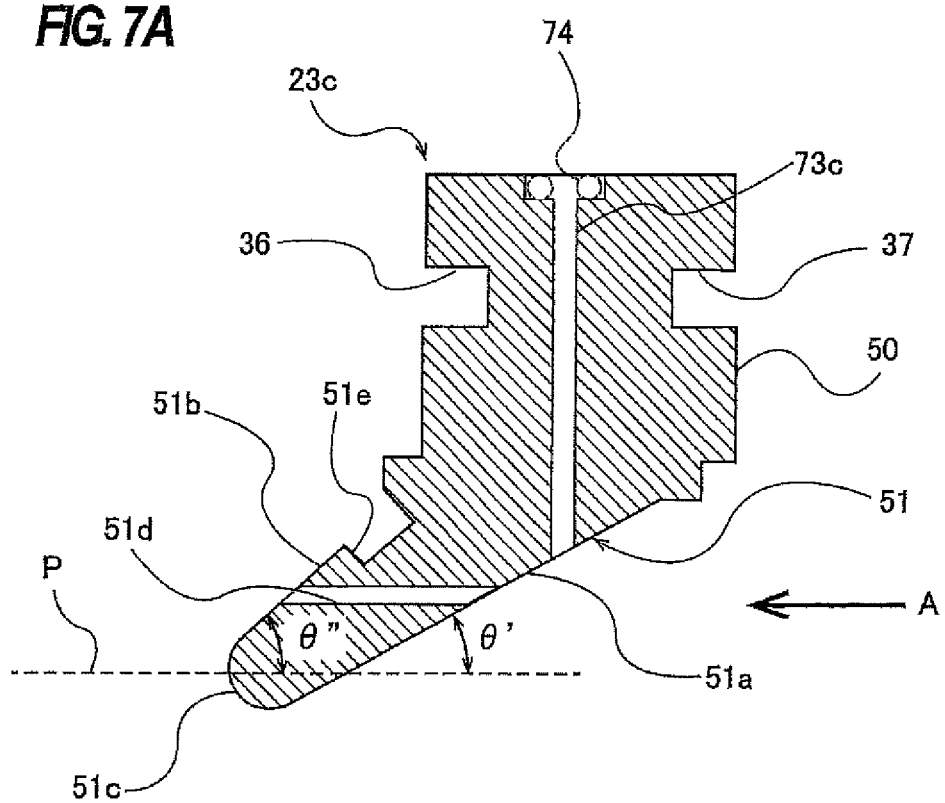
FIG. 7A is a cross-sectional view of a third coupling ring.
Figure 7B:
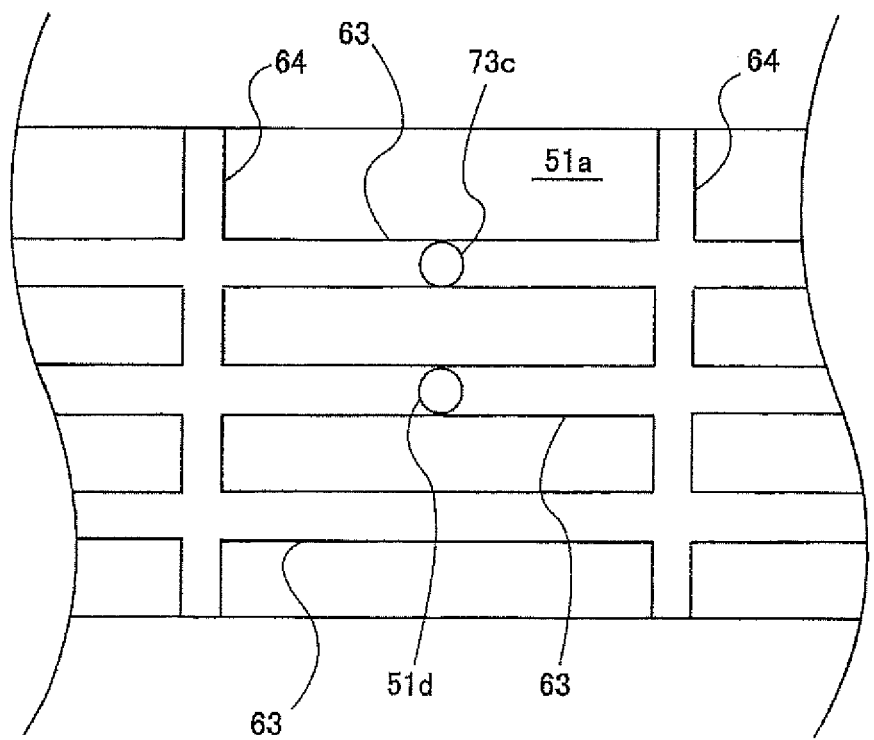
FIG. 7B is a view as viewed from an arrow A of FIG. 7A.

FIG. 7A is a cross-sectional view of the third coupling ring 23c, and FIG. 7B is a view as viewed from an arrow A of FIG. 7A. In FIG. 7A, the above seal member 74 is shown by imaginary lines (dotted lines). The third coupling ring 23c has a ring vertical portion 50 extending vertically with respect to the carrier 43 of the head body 2, and a ring slope portion 51 extending radially outwardly from the ring vertical portion 50 and being inclined downwardly. An inclination angle $\theta'$ of an inner circumferential surface 51a of the ring slope portion 51 with respect to a horizontal plane P parallel to the contact portion 11 of the elastic membrane 10 is smaller than the inclination angle $\theta$ (see FIG. 6) of the third inner circumferential wall 14c configured as the slope circumferential wall. An inclination angle $\theta''$ of an outer circumferential surface 51b of the ring slope portion 51 with respect to the horizontal plane P is larger than the inclination angle $\theta$ of the fourth inner circumferential wall 14d configured as the slope circumferential wall. The outer circumferential surface 51b of the ring slope portion 51 is connected to the inner circumferential surface 51a of the ring slope portion 51 at a tip end 51c of the ring slope portion 51. Therefore, the ring slope portion 51 has a cross-sectional shape which tapers gradually toward the tip end 51c of the ring slope portion 51. The tip end 51c of the ring slope portion 51 which connects the inner circumferential surface 51a and the outer circumferential surface 51b has a cross-sectional shape comprising a curvilinear surface (e.g., a semicircular cross-sectional shape). A radius of the curvilinear surface is preferably equal to a thickness of the inner circumferential wall in a radial direction. Further, the third coupling ring 23c has a through-hole 51d extending from the inner circumferential surface 51a to the outer circumferential surface 51b of the ring slope portion 51 of the third coupling ring 23c. Further, an annular seal groove 51e extending over the entire circumference of the outer circumferential surface 51b is formed in the outer circumferential surface 51b of the ring slope portion 51.

As shown in FIG. 7B, a plurality of horizontal grooves 63 extending in a circumferential direction of the inner circumferential surface 51a and a plurality of vertical grooves 64 allowing the adjacent horizontal grooves 63 to communicate with each other are formed in the inner circumferential surface 51a of the ring slope portion 51 of the third coupling ring 23c. In the present embodiment, the through-hole 73c of the fluid line 73 is open at the horizontal groove 63 formed in the inner circumferential surface 51a of the ring slope portion 51. The through-hole 51d is open at the horizontal groove 63 which is different from the horizontal groove 63 at which the fluid line 73 is open. The through-hole 73c of the fluid line 73 and the through-hole 51d may be open respectively at the vertical grooves 64 formed in the inner circumferential surface 51a of the ring slope portion 51. Although not shown in the drawing, a plurality of horizontal grooves extending in a circumferential direction of the outer circumferential surface 51b and a plurality of vertical grooves allowing the adjacent horizontal grooves to communicate with each other are formed in the outer circumferential 51b of the ring slope portion 51 of the third coupling ring 23c. It is desirable that the through-hole 51d is open at the horizontal groove or the vertical groove formed in the outer circumferential surface 51b of the ring slope portion 51.

The seal projection 54 of the inner circumferential wall 14 shown in FIG. 6 is fitted into the seal groove 51e formed in the outer circumferential surface 51b of the ring slope portion 51. When the elastic membrane 10 is coupled to the head body 2, the seal projection 54 is pressed against the bottom surface of the seal groove 51e by the inner circumferential surface 51a of the ring slope portion 51 of the coupling ring 23 positioned at the radially outer side of the seal projection 54. For example, the seal projection 54 formed at the tip end of the second inner circumferential wall 14b is fitted into the seal groove 51e formed in the outer circumferential surface 51b of the ring slope portion 51 of the first coupling ring 23a, and the seal projection 54 is pressed against the bottom surface of the seal groove 51e of the first coupling ring 23a by the inner circumferential surface 51 of the ring slope portion 51 of the second coupling ring 23b. Thus, the gap between the second inner circumferential wall 14b and the outer circumferential surface 51b of the ring slope portion 51 of the first coupling ring 23a and the gap between the second inner circumferential wall 14b and the inner circumferential surface 51a of the ring slope portion 51 of the second coupling ring 23b can be sealed. With this configuration, the fluid supplied to the respective pressure chambers 16a to 16e can be prevented from leaking from the respective pressure chambers 16a to 16e.

Figure 8:
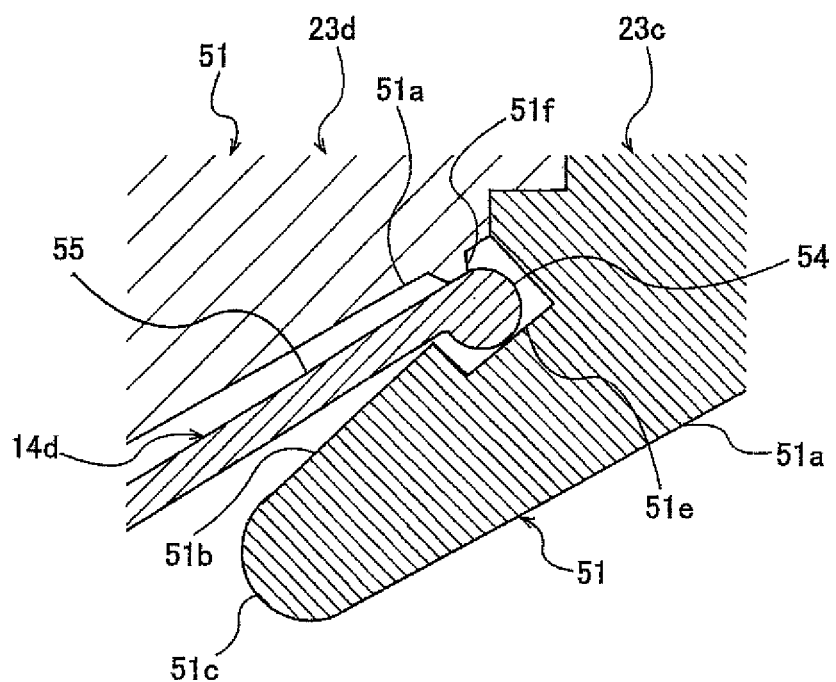
FIG. 8 is an enlarged cross-sectional view showing an example in which a pressing projection is formed in a circumferential surface of a ring slope portion of the coupling ring.

As shown FIG. 8, an annular pressing projection 51f facing the seal projection 54 fitted into the seal groove 51e may be formed on the inner circumferential surface 51a of the ring slope portion 51 of the coupling ring 23. The pressing projection 51f extends over the entire circumference of the inner circumferential surface 51a of the ring slope portion 51. The pressing projection 51f can press the seal projection 54 against the bottom surface of the seal groove 51e with a strong pressing force. As a result, the fluid supplied to the respective pressure chambers 16a to 16e can be effectively prevented from leaking from the respective pressure chambers 16a to 16e.

As shown in FIG. 5, the inner circumferential walls 14a to 14e are brought into contact with the coupling rings 23a to 23e, respectively, only by the seal projections 54. Specifically, a gap is formed between the ring slope portion 51 having a cross-sectional shape which tapers gradually toward the tip end 51c, and the inner circumferential wall 14 except for the seal projection 54. This gap allows each of the inner circumferential walls 14a to 14e to move in a radial direction when the pressurized fluid is supplied to the respective pressure chambers 16a to 16f. That is, each of the inner circumferential walls 14a to 14e rotates about the seal projection 54 as a fulcrum. As a result, the elastic membrane 10 can be smoothly inflated in response to pressures of the fluid supplied to the respective pressure chambers 16a to 16f, and thus the polishing profile can be adjusted precisely.

As described above, when the pressurized fluid is supplied to the respective pressure chambers 16a to 16f, the elastic membrane 10 is inflated, and the connecting portions between the inner circumferential walls 14a to 14f and the contact portion 11 move in a radial direction. However, because the above gaps are formed between the inner circumferential walls 14a to 14e and the coupling rings 23a to 23e at portions other than the seal projections 54 of the inner circumferential walls 14a to 14e, movement of the inner circumferential walls 14a to 14e in a radial direction to some extent is not hindered by the coupling rings 23a to 23e. Therefore, the elastic membrane 10 can be inflated in response to pressures of the fluid supplied to the respective pressure chambers 16a to 16f.

If there is a pressure difference between pressures of the fluid supplied to the adjacent pressure chambers 16, the inner circumferential wall 14 for partitioning these adjacent pressure chambers 16 tends to be deformed in a radial direction. However, deformation of the inner circumferential wall 14 in the radial direction is limited by the inner circumferential surface 51a or the outer circumferential surface 51b of the ring slope portion 51 of the coupling ring 23, and thus the inner circumferential wall 14 can be effectively prevented from being brought into contact with the contact portion 11. At the same time, the adjacent inner circumferential walls can be effectively prevented from being brought into contact with each other. In the present embodiment, the tip end 51c of the ring slope portion 51 of the coupling ring 23 has a cross-sectional shape comprising a curvilinear surface. Therefore, when the inner circumferential wall 14 is brought into contact with the tip end 51c of the ring slope portion 51, the inner circumferential wall 14 can be prevented from being damaged.

As described above, the coupling ring 23 has the horizontal grooves 63 and the vertical grooves 64 formed in the inner circumferential surface 51a and the outer circumferential surface 51b of the ring slope portion 51, and has the through-hole 51d which extends from the inner circumferential surface 51a to the outer circumferential surface 51b and is open at the horizontal groove 63 (or the vertical groove 64). Further, the through-hole 73c (see FIG. 5) of the fluid line 73 through which the fluid supplied to each of the pressure chambers 16a to 16f flows is open at the horizontal groove 63. Therefore, even if the inner circumferential wall 14 is brought into contact with the inner circumferential surface 51a and/or the outer circumferential surface 51b of the ring slope portion 51 of the coupling ring 23 by the pressure difference of the fluid supplied to the adjacent pressure chambers 16, the fluid flowing through the fluid line 73 can be quickly and smoothly supplied to the pressure chamber 16 through the horizontal groove 63, the vertical groove 64 and the through-hole 51d formed in the ring slope portion 51. As a result, even in a state where the inner circumferential wall 14 is brought in contact with the inner circumferential surface 51a and/or the outer circumferential surface 51b of the ring slope portion 51 of the coupling ring 23, the pressure of the fluid supplied from the fluid line 73 can be applied quickly to the contact portion 11.

As shown in FIG. 5, the tip end 51c of the ring slope portion 51 is preferably positioned below an intermediate point CP of each of the inner circumferential walls 14a to 14e configured as the slope circumferential walls. As shown in FIG. 6, the intermediate point CP is positioned at the center of each of the inner circumferential walls 14a to 14e extending obliquely upwardly at a certain inclination angle θ. Specifically, the distance L1 between the intermediate point CP of each of the inner circumferential walls 14a to 14e and the contact portion 11 is equal to the distance L2 between the intermediate point CP and the tip end of each of the inner circumferential walls 14a to 14e.

When the vacuum is produced in the pressure chamber (e.g., the intermediate pressure chamber 16c) to attract the wafer W to the substrate holding surface 10a of the elastic membrane 10, the elastic membrane 10 is deformed toward the head body 2. If the deformation amount of the elastic membrane 10 is large, the stress generated in the wafer W may increase, and electronic circuits formed on the wafer W may be damaged or the wafer W may be cracked. In the present embodiment, because the tip end 51c of the ring slope portion 51 is positioned below the intermediate point CP of each of the inner circumferential walls 14a to 14e, the distance between the contact portion 11 and the tip end 51c of the ring slope portion 51 is short. Therefore, when the wafer W is attracted to the substrate holding surface 10a (see FIG. 2) of the elastic membrane 10 under vacuum, the elastic membrane 10 is brought into contact with the tip end 51c of the ring slope portion 51, so that the deformation amount of the elastic membrane 10 can be reduced. As a result, the stress generated in the wafer W can be reduced. Further, because the tip end 51c of the ring slope portion 51 has a cross-sectional shape comprising a curvilinear surface, when the elastic membrane 10 is brought into contact with the tip end 51c of the ring slope portion 51, the elastic membrane 10 can be prevented from being damaged.

Figure 22:
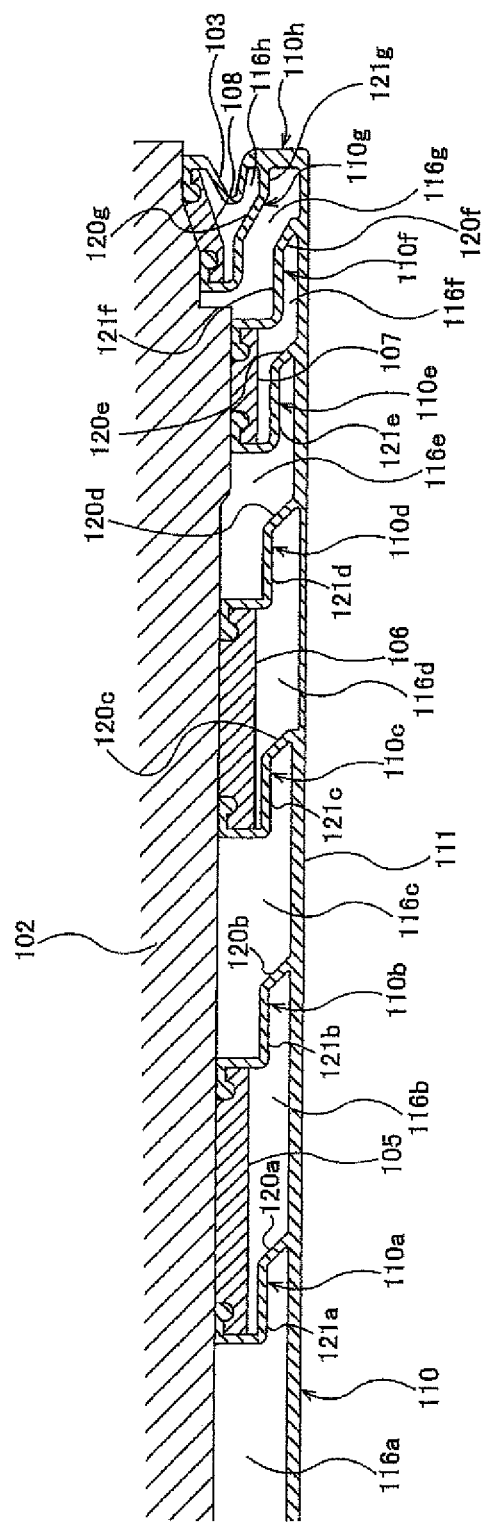
FIG. 22 is a cross-sectional view showing an example of a conventional elastic membrane.

According to the present embodiment, the inner circumferential walls 14 are configured as the slope circumferential walls with no horizontal portions which have been formed in the conventional circumferential walls (see the horizontal portions 121a to 121g of FIG. 22). Further, the inner circumferential walls 14 have the same shape and extend parallel (or substantially parallel) to one another. Therefore, even if the pressure difference between pressures of the fluid supplied to the adjacent pressure chambers is large, the inner circumferential wall 14 is not brought into contact with the contact portion 11. Further, the adjacent inner circumferential walls 14 can be prevented from being brought into contact with each other. In particular, because the coupling ring 23 having the ring slope portion 51 configured to limit movement of the inner circumferential wall 14 to the radially inner side or the radially outer side is provided between the adjacent inner circumferential walls 14, the contact between the inner circumferential wall 14 and the contact portion 11, and the contact between the adjacent inner circumferential walls 14 can be effectively prevented. As a result, the polishing profile of the wafer W held by the polishing head (substrate holding apparatus) 1 can be precisely adjusted.

Further, according to the present embodiment, because the inner circumferential walls 14 configured as the slope circumferential walls extend parallel to one another, the interval between the adjacent inner circumferential walls 14 can be made small. As a result, the width of each of the pressure chambers 16a to 16e in a radial direction can be made small, and hence the polishing profile of the wafer W held by the polishing head (substrate holding apparatus) 1 can be precisely adjusted.

In the case where the inner circumferential walls 14 are configured as the slope circumferential walls, the interval between the adjacent inner circumferential walls 14 can be set arbitrarily according to the polishing profile of the wafer W. Specifically, the interval between the adjacent inner circumferential walls 14 can be set to a desired interval (for example, extremely narrow interval). At least two inner circumferential walls adjacent to each other of the plural inner circumferential walls 14a to 14e may be configured as slope circumferential walls. For example, the inner circumferential wall 14c, the inner circumferential wall 14d and the inner circumferential wall 14e may be configured as slope circumferential walls, or the two inner circumferential walls 14d and 14e arranged adjacent to the edge circumferential wall 14f may be configured as slope circumferential walls.

Figure 9:
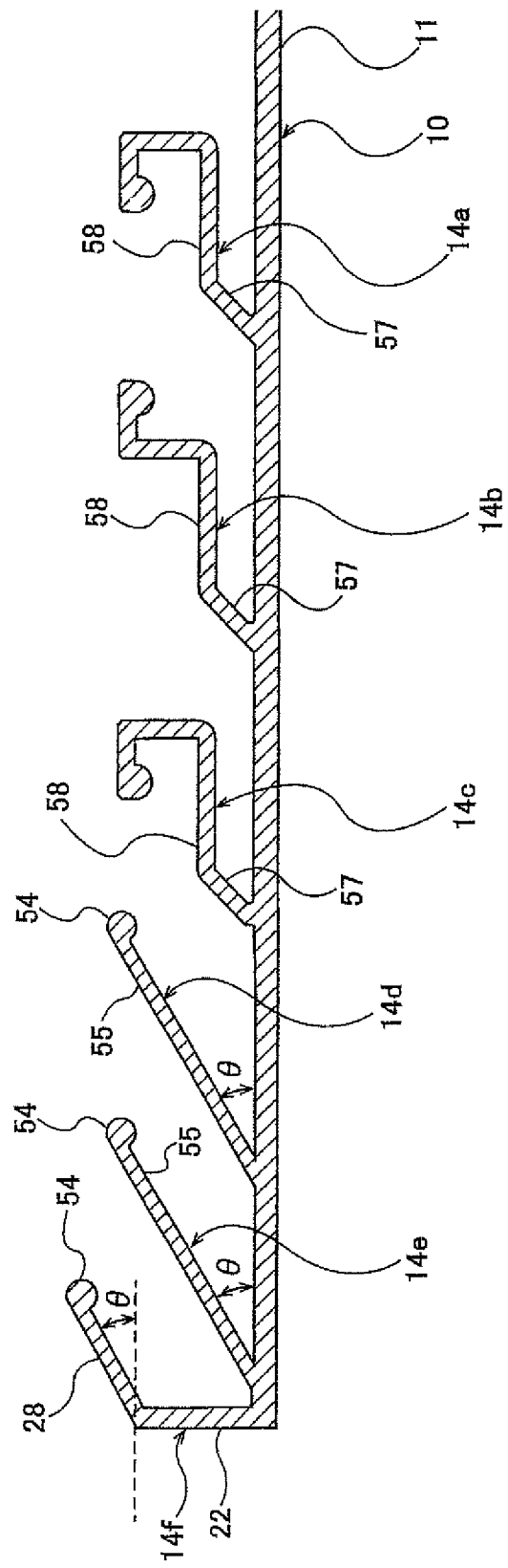
FIG. 9 is a cross-sectional view showing an example of an elastic membrane in which two inner circumferential walls arranged adjacent to an edge circumferential wall are configured as slope circumferential walls.

FIG. 9 is a cross-sectional view showing an example of the elastic membrane 10 in which two inner circumferential walls 14d and 14e arranged adjacent to an edge circumferential wall 14f are configured as slope circumferential walls. In the elastic membrane 10 shown in FIG. 9, the inner circumferential walls 14a, 14b and 14c have slope portions 57 inclined toward a radially inner side from the contact portion 11, and horizontal portions 58 extending horizontally from the slope portions 57, respectively, in the same manner as the inner circumferential walls 114a, 114b and 114c of the conventional elastic membrane 110 described with reference to FIG. 22. In the case where the inner circumferential walls 14d and 14e are configured as the slope circumferential walls, the width of the pressure chamber 16e partitioned by the inner circumferential walls 14d and 14e can be made small. Therefore, by using the elastic membrane 10 shown in FIG. 9, the polishing profile of the peripheral edge portion of the wafer W can be precisely adjusted.

The coupling rings 23 are fixed to the carrier 43 by a plurality of fixing members. By fixing the coupling rings 23 to the carrier 43 by the fixing members, the elastic membrane 10 is coupled to the head body 2. When the elastic membrane 10 having a small interval between the adjacent inner circumferential walls 14 configured as the slope circumferential walls is coupled to the head body 2, the width of the coupling ring 23 of the head body 2 in a radial direction also becomes small. As a result, the fixing members for fixing the coupling rings 23 to the carrier 43 must be arranged in a narrow space. Further, if the fixing members for fixing the coupling rings 23 to the carrier 43 are large in number, the amount of work for attaching and removing the elastic membrane 10 from the carrier 43 at the time of maintenance is forced to increase.

Further, there is a limit on a space for installing the fixing members for fixing the coupling rings 23 to the carrier 43 of the head body 2. More specifically, since the plural fluid lines 73 (see FIG. 2) for supplying the fluid to the respective pressure chambers 16a to 16e pass through the carrier 43 of the head body 2, it is necessary to install the fixing members so as not to be brought into contact with these fluid lines 73. Further, the plural radial grooves 43a (see FIG. 3) for accommodating the spokes 78 therein are formed in the carrier 43 of the head body 2, and thus the fixing members cannot be installed at the positions where these grooves 43a are formed.

Therefore, in the present embodiment, the polishing head 1 has fixing members 70 for fixing the adjacent two inner circumferential walls 14 configured as the slope circumferential walls to the head body 2 simultaneously via the three coupling rings 23. The fixing member 70, and a method for fixing the coupling rings 23, to which the elastic membrane 10 is coupled, to the head body 2 using the fixing members 70 will be described below.

Figure 10A:
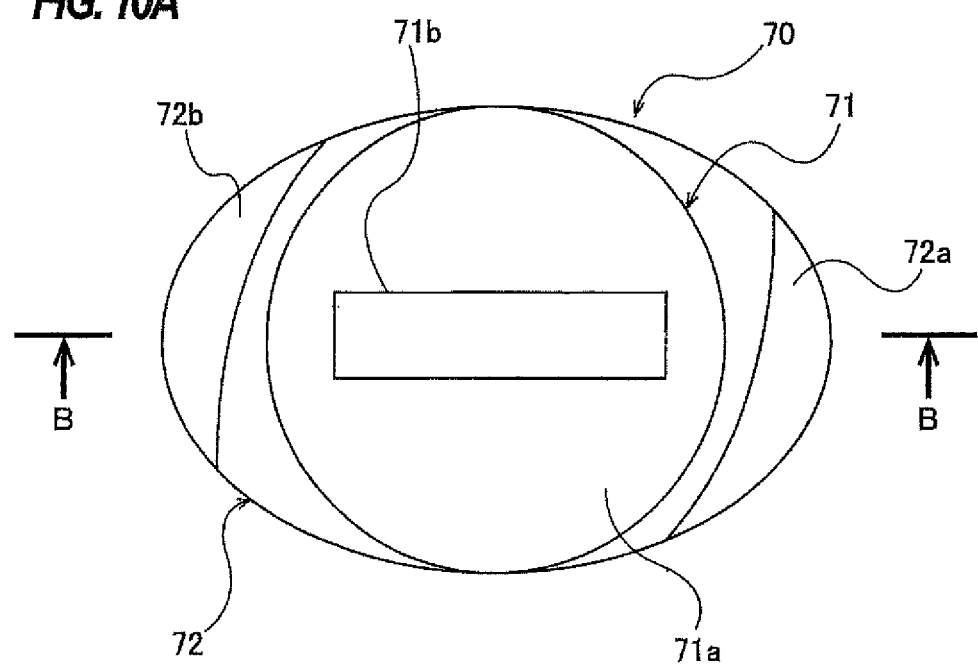
FIG. 10A is a top plan view of a fixing member.
Figure 10B:
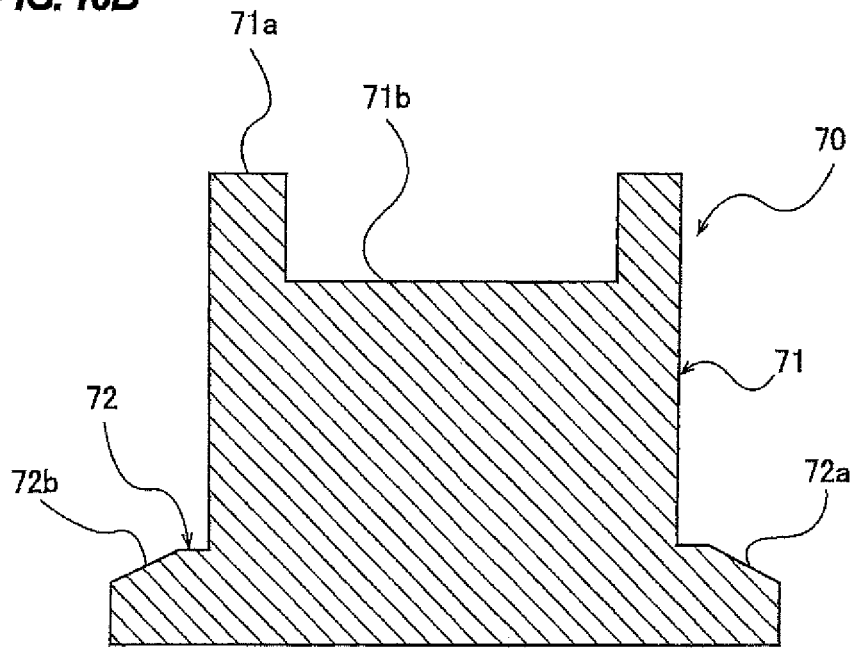
FIG. 10B is a cross-sectional view taken along line B-B of FIG. 10A.

FIG. 10A is a top plan view of the fixing member 70, and FIG. 10B is a cross-sectional view taken along line B-B of FIG. 10A. As shown in FIGS. 10A and 10B, the fixing member 70 comprises a columnar fixing member body 71, and an elliptically shaped flange 72 projecting outwardly from the outer circumferential surface of the fixing member body 71. The flange 72 has two inclined surfaces 72a and 72b, and these inclined surfaces 72a and 72b extend to the outer circumferential surface of the flange 72. A thickness of the flange 72 in a vertical direction except for the inclined surfaces 72a and 72b is the same as a vertical width of an engagement groove (described later) formed in the ring vertical portion 50 of the coupling ring 23. A groove 71b with which a tip end of a jig (not shown, e.g., a flathead screwdriver) is engageable is formed in the upper surface 71a of the fixing member body 71. By allowing the tip end of the jig to engage with the groove 71b and rotating the jig, the fixing member 70 can be rotated.

A method for fixing the three coupling rings 23 to the carrier 43 of the head body 2 simultaneously by using the fixing member 70 shown in FIGS. 10A and 10B will be described below. When the three coupling rings 23 are fixed to the carrier 43, the adjacent two inner circumferential walls 14 are coupled to the head body 2 simultaneously. In the following description, the coupling ring 23 positioned at the radially inner side of the three coupling rings 23 is occasionally referred to as an inner-side coupling ring 23, the coupling ring 23 positioned at the radially outer side of the three coupling rings 23 is occasionally referred to as an outer-side coupling ring 23, and the coupling ring 23 positioned between the inner-side coupling ring 23 and the outer-side coupling ring 23 is occasionally referred to as an intermediate coupling ring. Further, the inner circumferential wall 14 positioned at the radially inner side of the adjacent two inner circumferential walls 14 configured as the slope circumferential walls is occasionally referred to as an inner-side slope circumferential wall 14, and the inner circumferential wall 14 positioned at the radially outer side of the adjacent two inner circumferential walls 14 configured as the slope circumferential walls is occasionally referred to as an outer-side slope circumferential wall 14.

FIGS. 11 to 14 are schematic views showing processes for fixing the three coupling rings 23 to the carrier 43 simultaneously by using the fixing members 70 shown in FIGS. 10A and 10B to couple the elastic membrane 10 shown in FIG. 6 to the head body 2.

In the elastic membrane 10 shown in FIG. 6, the second inner circumferential wall 14b is the inner-side slope circumferential wall 14, and the third inner circumferential wall 14c is the outer-side slope circumferential wall 14. With respect to the second inner circumferential wall 14b and the third inner circumferential wall 14c, the first coupling ring 23a is the inner-side coupling ring 23, the second coupling ring 23b is the intermediate coupling ring 23, and the third coupling ring 23c is the outer-side coupling ring 23. By fixing the coupling rings 23a to 23c to the carrier 43 by the fixing member 70, the second inner circumferential wall 14b and the third inner circumferential wall 14c are coupled to the head body 2. Similarly, the fourth inner circumferential wall 14d is the inner-side slope circumferential wall 14, and the fifth inner circumferential wall 14e is the outer-side slope circumferential wall 14. With respect to the fourth inner circumferential wall 14d and the fifth inner circumferential wall 14e, the third coupling ring 23c is the inner-side coupling ring 23, the fourth coupling ring 23d is the intermediate coupling ring 23, and the fifth coupling ring 23e is the outer-side coupling ring 23. By fixing the coupling rings 23c to 23e to the carrier 43 by the fixing member 70, the fourth inner circumferential wall 14d and the fifth inner circumferential wall 14e are coupled to the head body 2. Thus, the third coupling ring 23c is the outer-side coupling ring 23 with respect to the second inner circumferential wall 14b and the third inner circumferential wall 14c, and is the inner-side coupling ring 23 with respect to the fourth inner circumferential wall 14d and the fifth inner circumferential wall 14e.

Figure 11:
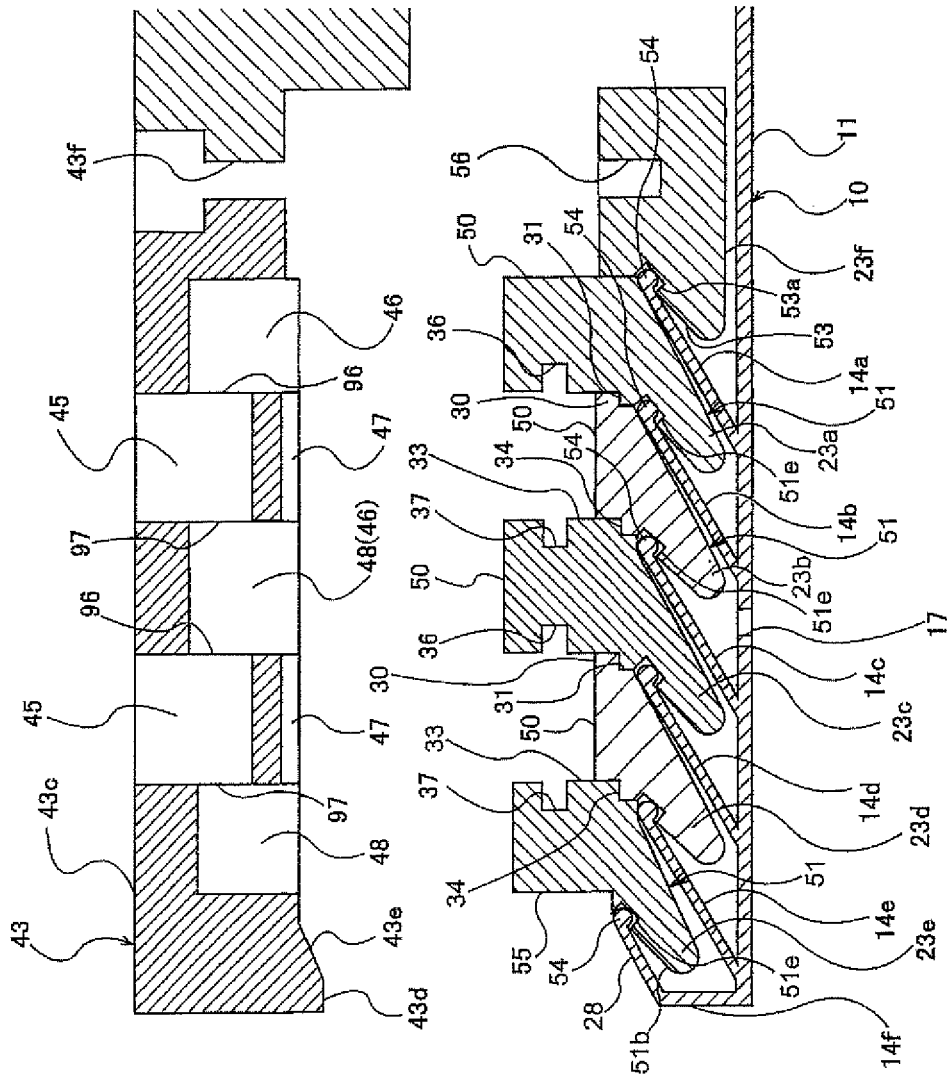
FIG. 11 is a schematic view showing processes for fixing the three coupling rings to the carrier simultaneously by using the fixing members shown in FIGS. 10A and 10B to couple the elastic membrane shown in FIG. 6 to the head body.

As shown in FIG. 11, a plurality of first recesses 45 into which the plural fixing members 70 are respectively inserted are formed in the upper surface 43c of the carrier 43 of the head body 2. Each of the first recesses 45 extends from the upper surface 43c of the carrier 43 toward the lower surface 43d of the carrier 43. The first recess 45 has an elliptically-shaped cross section so as not to be brought into contact with the flange 72 of the fixing member 70 inserted into the first recess 45. Further, an annular second recess 46 into which the ring vertical portion 50 of the inner-side coupling ring 23 is inserted, an annular third recess 47 into which the ring vertical portion 50 of the intermediate coupling ring 23 is inserted, and a fourth recess 48 into which the ring vertical portion 50 of the outer-side coupling ring 23 is inserted, are formed in the lower surface 43d of the carrier 43. The second recess 46, the third recess 47 and the fourth recess 48 extend over the entire circumference of the carrier 43, and extend from the lower surface 43d toward the upper surface 43c of the carrier 43.

An inner-side opening 96 is formed in an inner surface located at a radially inner side of the first recess 45, and an outer-side opening 97 is formed in an inner surface located at a radially outer side of the first recess 45. The first recess 45 communicates with the second recess 46 through the inner-side opening 96, and communicates with the fourth recess 48 through the outer-side opening 97. When the fixing member 70 inserted into the first recess 45 is rotated, the flange 72 of the fixing member 70 projects into the second recess 46 and the fourth recess 48 through the inner-side opening 96 and the outer-side opening 97.

The intermediate coupling ring 23 is sandwiched between the inner-side coupling ring 23 and the outer-side coupling ring 23 and is thus held by the inner-side coupling ring 23 and the outer-side coupling ring 23. For example, the second coupling ring 23b as the intermediate coupling ring 23 is held by the first coupling ring 23a as the inner-side coupling ring 23 and the third coupling ring 23c as the outer-side coupling ring 23. Similarly, the fourth coupling ring 23d as the intermediate coupling ring 23 is held by the third coupling ring 23c as the inner-side coupling ring 23 and the fifth coupling ring 23e as the outer-side coupling ring 23.

In the present embodiment, the intermediate coupling ring 23 has an annular projecting portion 30 projecting outwardly from the outer circumferential surface of the intermediate coupling ring 23, and the inner-side coupling ring 23 has an annular step portion 31 on which the projecting portion 30 is placed. Further, the outer-side coupling ring 23 has an annular projecting portion 33 projecting outwardly from the outer circumferential surface of the outer-side coupling ring 23, and the intermediate coupling ring 23 has an annular step portion 34 on which the projecting portion 33 is placed. The third coupling ring 23c serves as the outer-side coupling ring 23 with respect to the second inner circumferential wall 14b and the third inner circumferential wall 14c, and serves as the inner-side coupling ring 23 with respect to the fourth inner circumferential wall 14d and the fifth inner circumferential wall 14e. Therefore, the third coupling ring 23c has an annular projecting portion 33 and an annular step portion 31.

Further, an inner-side engagement groove 36 with which the flange 72 of the fixing member 70 is engageable is formed in the ring vertical portion 50 of the inner-side coupling ring 23, and an outer-side engagement groove 37 with which the flange 72 of the fixing member 70 is engageable is formed in the ring vertical portion 50 of the outer-side coupling ring 23. The third coupling ring 23c serves as the outer-side coupling ring 23 with respect to the second inner circumferential wall 14b and the third inner circumferential wall 14c, and serves as the inner-side coupling ring 23 with respect to the fourth inner circumferential wall 14d and the fifth inner circumferential wall 14e. Therefore, the third coupling ring 23c has an inner-side engagement groove 36 and an outer-side engagement groove 37.

The seal projection 54 formed at the tip end of the inner-side slope circumferential wall 14 (e.g., the second inner circumferential wall 14b) is fitted into the seal groove 51e formed in the outer circumference of the ring slope portion 51 of the inner-side coupling ring 23 (e.g., the first coupling ring 23a). The seal projection 54 formed at the tip end of the outer-side slope circumferential wall 14 (e.g., the third inner circumferential wall 14c) is fitted into the seal groove 51e formed in the outer circumferential surface of the ring slope portion 51 of the intermediate coupling ring 23 (e.g., the second coupling ring 23b). Further, the projecting portion 30 of the intermediate coupling ring 23 is placed on the step portion 31 of the inner-side coupling ring 23, and the projecting portion 33 of the outer-side coupling ring 23 is placed on the step portion 34 of the intermediate coupling ring 23. This state is shown in FIG. 11.

As shown in FIG. 11, the first inner circumferential wall 14a of the elastic membrane 10 is also configured as the slope circumferential wall. The first inner circumferential wall 14a is coupled to the additional coupling ring 23f and the additional coupling ring 23f is fixed to the carrier 43, and thus the first inner circumferential wall 14a is coupled to the head body 2. More specifically, the additional coupling ring 23f has an inclined surface 53, and a seal groove 53a into which the seal projection 54 formed at the tip end of the first inner circumferential wall 14a is fitted is formed in the inclined surface 53. The first inner circumferential wall 14a is sandwiched between the first coupling ring 23a and the additional coupling ring 23f in a state where the seal projection 54 of the first inner circumferential wall 14a is fitted into the seal groove 53a of the additional coupling ring 23f. Thus, the first inner circumferential wall 14a is held by the first coupling ring 23a and the additional coupling ring 23f. Further, the edge circumferential wall 14f of the elastic membrane 10 has the slope portion 28. A seal projection 54 is formed at the tip end of the slope portion 28, and a seal groove 51e into which the seal projection 54 is fitted is formed in the outer circumferential surface 51b of the ring slope portion 51 of the fifth coupling ring 23e. When the elastic membrane 10 is coupled to the carrier 43 of the head body 2, the inner circumferential walls 14b to 14e and the edge circumferential wall 14f of the elastic membrane 10 are held in advance by the coupling rings 23a to 23e, and the inner circumferential wall 14a is held in advance by the additional coupling ring 23f.

Figure 12:
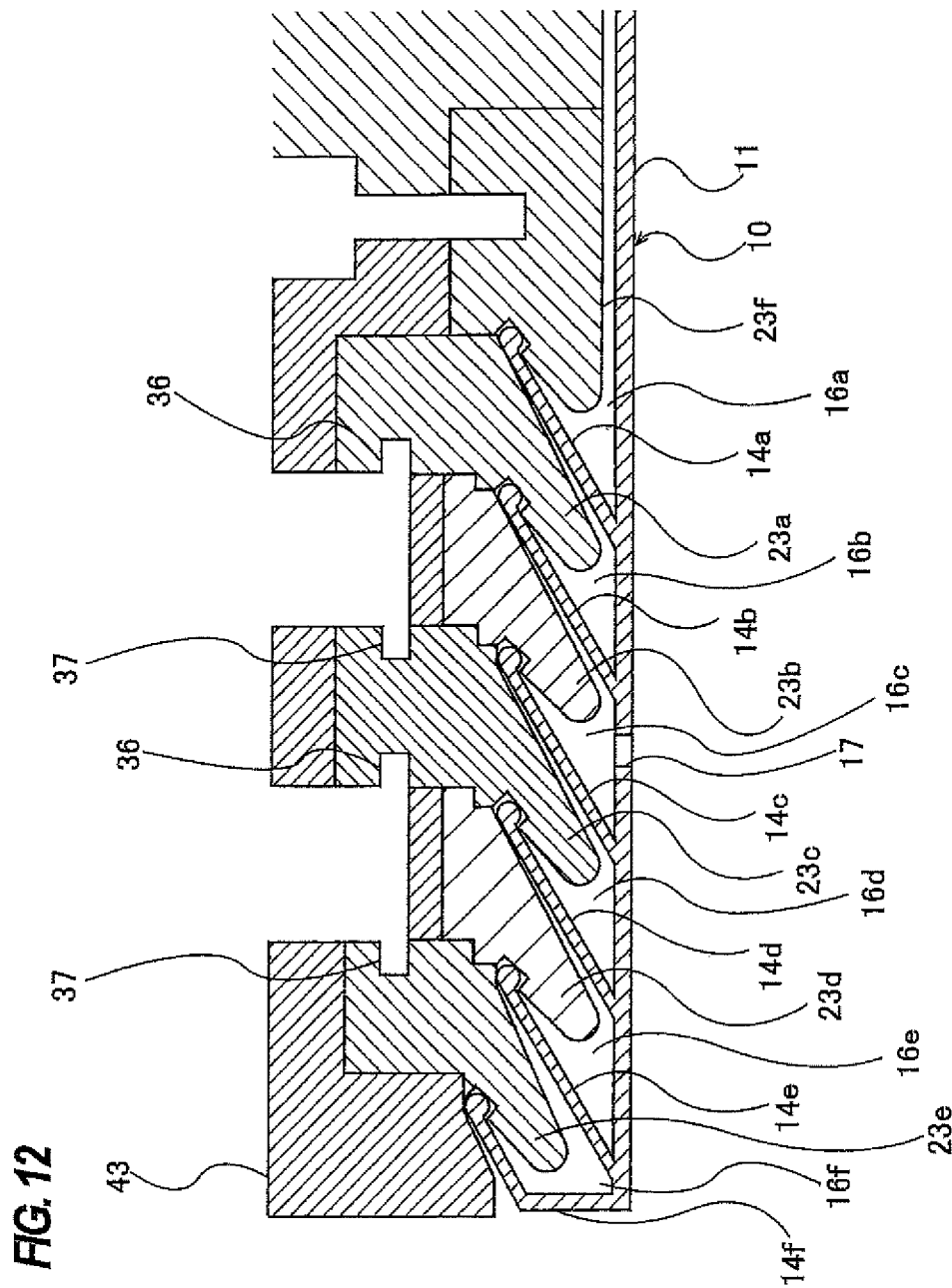
FIG. 12 is a schematic view showing processes for fixing the three coupling rings to the carrier simultaneously by using the fixing members shown in FIGS. 10A and 10B to couple the elastic membrane shown in FIG. 6 to the head body.

Then, as shown in FIG. 12, the elastic membrane 10, the coupling rings 23a to 23e and the additional coupling ring 23f are moved toward the carrier 43, whereby the respective coupling rings 23a to 23e are inserted into the recesses 46, 47, and 48 (see FIG. 11) formed in the lower surface 43b of the carrier 43. As shown in FIG. 11, the recess into which the third coupling ring 23c is inserted is the fourth recess 48 with respect to the second inner circumferential wall 14b and the third inner circumferential wall 14c, and is the second recess 46 with respect to the fourth inner circumferential wall 14d and the fifth inner circumferential wall 14e.

Figure 13:
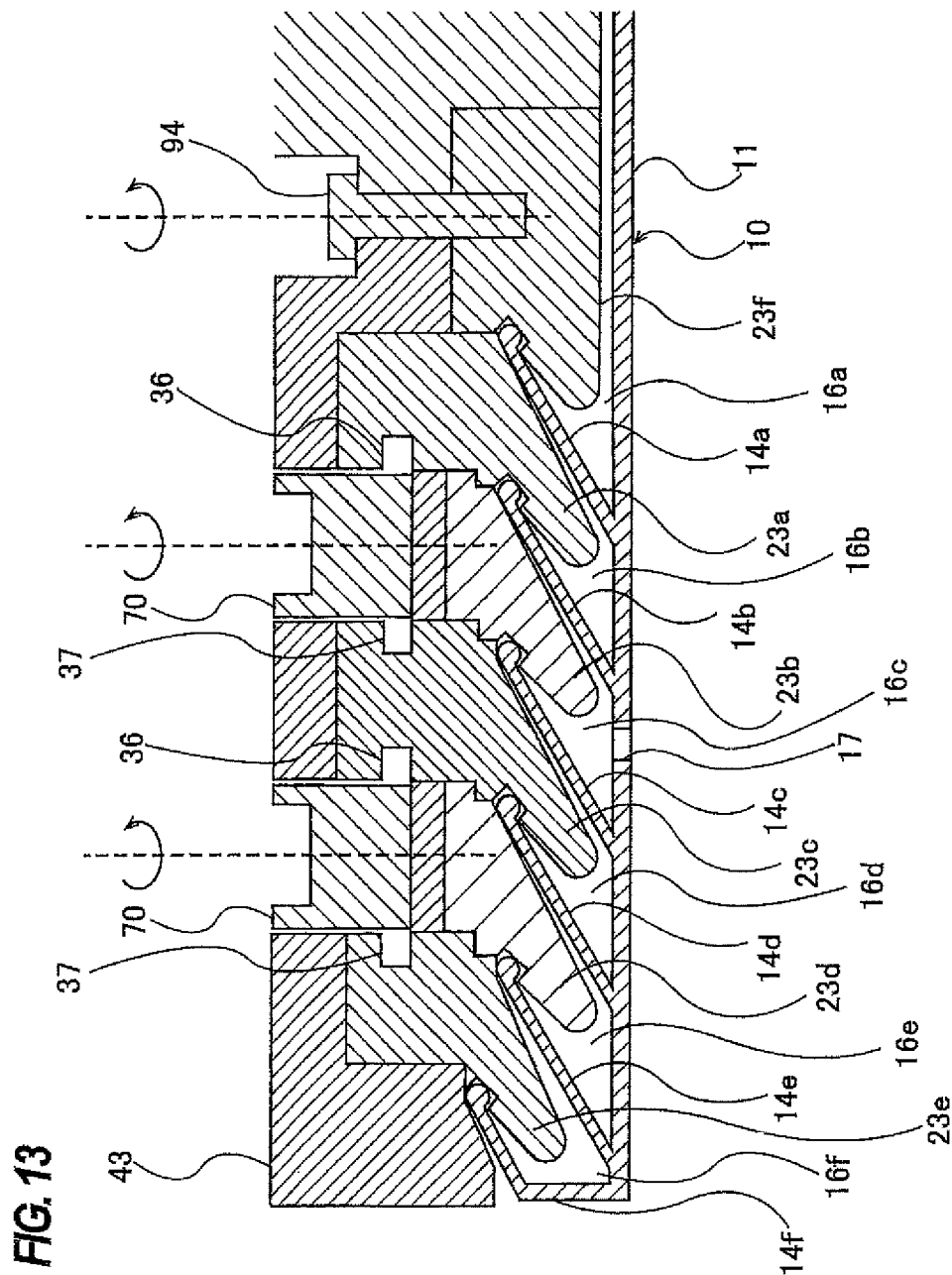
FIG. 13 is a schematic view showing processes for fixing the three coupling rings to the carrier simultaneously by using the fixing members shown in FIGS. 10A and 10B to couple the elastic membrane shown in FIG. 6 to the head body.
Figure 14:
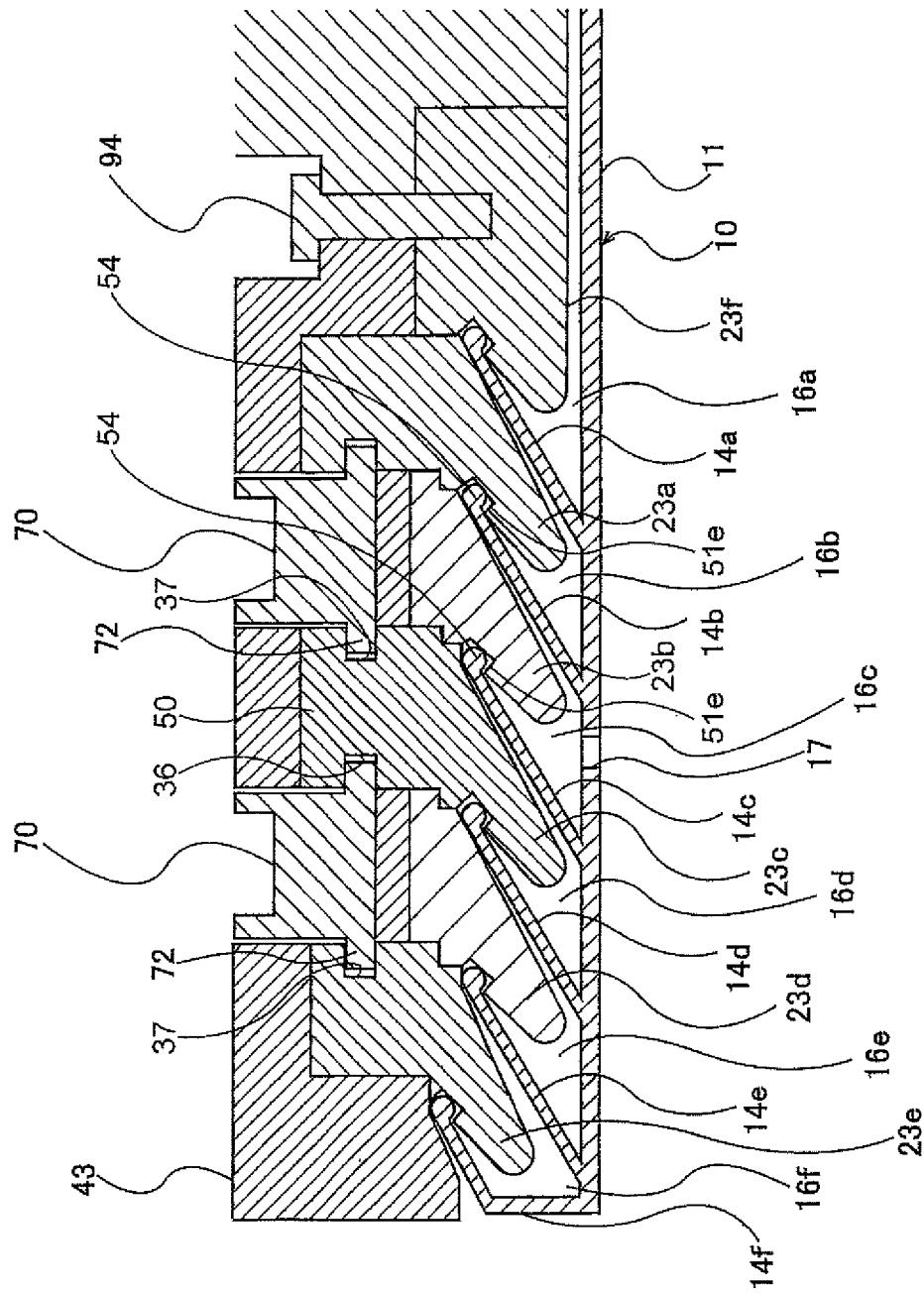
FIG. 14 is a schematic view showing processes for fixing the three coupling rings to the carrier simultaneously by using the fixing members shown in FIGS. 10A and 10B to couple the elastic membrane shown in FIG. 6 to the head body.

Then, as shown in FIG. 13, the fixing members 70 are inserted into the first recesses 45 formed in the upper surface 43c of the carrier 43, and the fixing members 70 are rotated by the jig (not shown). When the fixing member 70 is rotated, as shown in FIG. 14, the flange 72 of the fixing member 70 is engaged with the inner-side engagement groove 36 formed in the ring vertical portion 50 of the inner-side coupling ring 23 and the outer-side engagement groove 37 formed in the ring vertical portion 50 of the outer-side coupling ring 23, respectively, through the inner-side opening 96 and the outer-side opening 97 (see FIG. 11).

As shown in FIGS. 10A and 10B, the two inclined surfaces 72a and 72b are formed on the flange 72 of the fixing member 70. The inclined surfaces 72a and 72b extend to the outer circumferential surface of the flange 72. By these inclined surfaces 72a and 72b, the flange 72 can move smoothly into the engagement grooves 36 and 37.

Because the thickness of the flange 72 except for the inclined surfaces 72a and 72b is equal to the vertical width of the engagement grooves 36 and 37, the flange 72 which has moved smoothly into the engagement grooves 36 and 37 is engaged with the engagement grooves 36 and 37 tightly. As a result, the inner-side coupling ring (e.g., the first coupling ring 23a) and the outer-side coupling ring (e.g., the third coupling ring 23c) are tightly fixed to the carrier 43. At this time, the intermediate coupling ring 23 (e.g., the second coupling ring 23b) held by the inner-side coupling ring 23 and the outer-side coupling ring 23 is also coupled to the inner-side coupling ring 23 and the outer-side coupling ring 23 firmly. At the same time, the seal projection 54 of the inner-side slope circumferential wall (e.g., the second inner circumferential wall 14b) is pressed against the seal groove 51e formed in the outer circumferential surface 51b of the ring slope portion 51 of the inner-side coupling ring 23 by the inner circumferential surface 51a of the ring slope portion 51 of the intermediate coupling ring 23. Further, the seal projection 54 of the outer-side slope circumferential wall (e.g., the third inner circumferential wall 14c) is pressed against the seal groove 51e formed in the outer circumferential surface 51b of the ring slope portion 51 of the intermediate coupling ring 23 by the inner circumferential surface 51a of the ring slope portion 51 of the outer-side coupling ring 23. Thus, the gap between the inner-side slope circumferential wall 14 and the inner-side coupling ring 23 and the gap between the inner-side slope circumferential wall 14 and the intermediate coupling ring 23 are sealed, and the gap between the outer-side slope circumferential wall 14 and the intermediate coupling ring 23 and the gap between the outer-side slope circumferential wall 14 and the outer-side coupling ring 23 are sealed. As described with reference to FIG. 8, the pressing projection 51f for pressing the seal projection 54 against the seal groove 51e may be formed on the inner circumferential surface 51a of the ring slope portion 51 of the coupling ring 23.

The seal projection 54 of the edge circumferential wall 14f is pressed against the seal groove 51e formed in the outer circumferential surface 51b of the ring slope portion 51 of the fifth coupling ring 23e by an inclined portion 43e (see FIG. 11) formed in the lower surface of the carrier 43. Thus, the gap between the edge circumferential wall 14f and the fifth coupling ring 23e and the gap between the edge circumferential wall 14f and the carrier 43 are sealed. The annular pressing projection 51f described with reference to FIG. 8 may be provided on the inclined portion 43e. When the elastic membrane 10 is coupled to the head body 2, the seal projection 54 of the edge circumferential wall 14f is pressed against the seal groove 51e formed in the outer circumferential surface 51b of the ring slope portion 51 of the fifth coupling ring 23e under a strong pressing force by the pressing projection 51f provided on the inclined portion 43e. As a result, the fluid can be effectively prevented from leaking from the pressure chamber 16f.

In the present embodiment, the additional coupling ring 23f is fixed to the carrier 43 by a plurality of screws 94. Through-holes 43f (see FIG. 11) into which the screws 94 are inserted are formed in the carrier 43, and screw holes 56 extending from the upper surface toward the lower surface of the additional coupling ring 23f are formed in the additional coupling ring 23f. The screws 94 are inserted into the through-holes 43f, and are engaged with the screw holes 56, thereby fixing the additional coupling ring 23f to the carrier 43 tightly. At this time, the seal projection 54 of the first inner circumferential wall 14a is pressed against the seal groove 53a formed in the inclined surface 53 of the additional coupling ring 23f by the inner circumferential surface 51a of the ring slope portion 51 of the first coupling ring 23a. Thus, the gap between the first inner circumferential wall 14a and the additional coupling ring 23f and the gap between the first inner circumferential wall 14a and the first coupling ring 23a are sealed.

Figure 15:
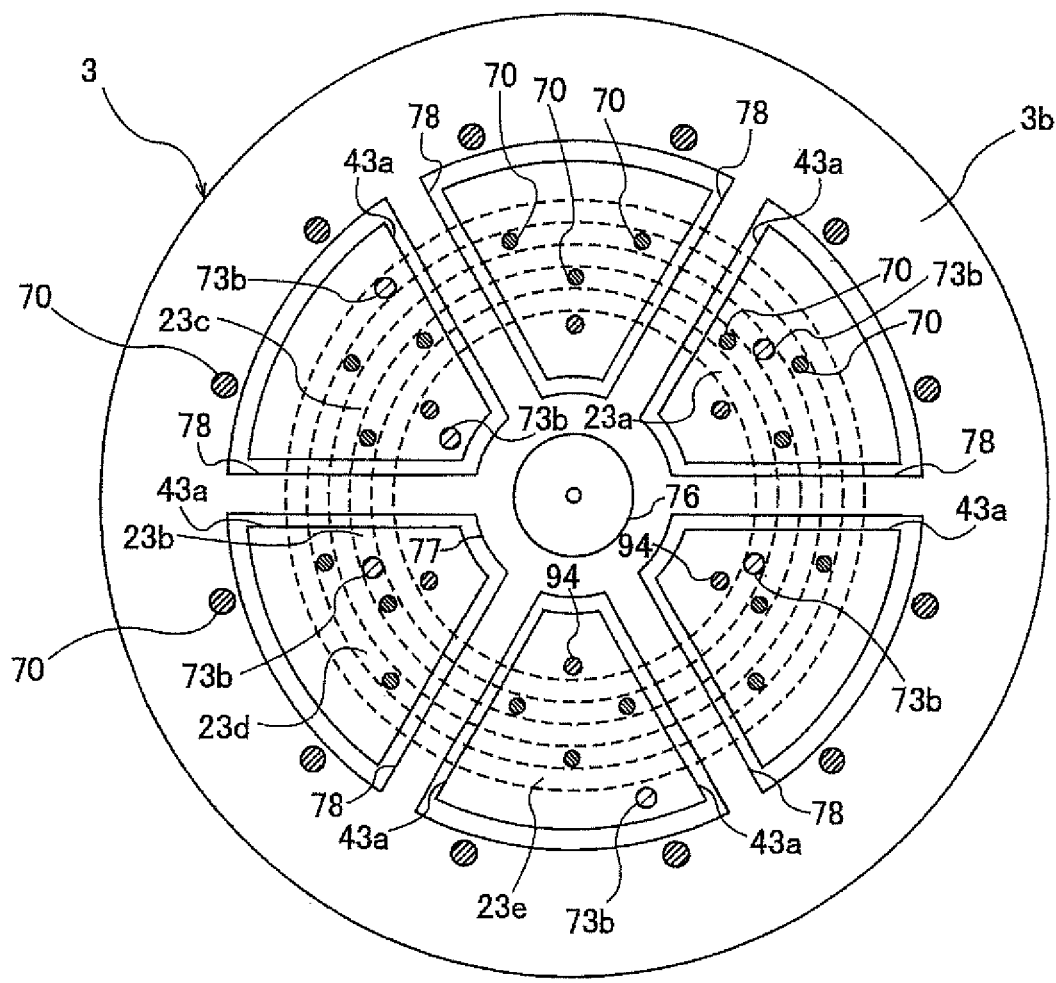
FIG. 15 is a schematic view showing an example of arrangement of the fixing members.

FIG. 15 is a schematic view showing an example of arrangement of the fixing members 70. As shown in FIG. 15, the first coupling ring 23a, the second coupling ring 23b and the third coupling ring 23c are fixed to the carrier 43 by the plural fixing members 70 arranged in a circumferential direction of the second coupling ring 23b. The third coupling ring 23c, the fourth coupling ring 23d and the fifth coupling ring 23e are fixed to the carrier 43 by the plural fixing members 70 arranged in a circumferential direction of the fourth coupling ring 23d. In this manner, by fixing the three coupling rings 23 to the carrier 43 simultaneously by using the above fixing members 70, even if the widths of the pressure chambers 16a to 16e in a radial direction are small, the elastic membrane 10 can be coupled to the head body 2. Further, the number of the fixing members 70 can be reduced, and thus the amount of work for attaching and removing the elastic membrane 10 can be reduced.

As shown in FIG. 15, a plurality of through-holes 73b for the fluid lines 73 for supplying the fluid to the respective pressure chambers 16a to 16e are formed in the carrier 43. The seal member 44 for preventing the fluid flowing through the through-holes 73a and 73b from leaking from the gap between the spacer 42 and the carrier 43 is provided in the through-hole 73b (see FIG. 5). Further, as described with referenced to FIG. 3, the plural radial grooves 43a for housing the spokes 78 are formed in the carrier 43. According to the present embodiment, since the three coupling rings 23 are fixed to the carrier 43 of the head body 2 by the fixing members 70 to couple the adjacent two inner circumferential walls 14 to the head body 2, the fixing members 70 can be easily arranged at positions different from the through-hole 73b and the groove 43a. Further, since the number of the fixing members 70 can be reduced, the elastic membrane can be easily attached and removed.

When the elastic membrane 10 is removed from the carrier 43 of the head body 2 for maintenance or replacement of the elastic membrane 10, first, the fixing member 70 is rotated by the jig (not shown) to disengage the flange 72 of the fixing member 70 from the inner-side engagement groove 36 of the inner-side coupling ring 23 and the outer-side engagement groove 37 of the outer-side coupling ring 23 (see FIG. 13). This operation is performed on all the fixing members 70 Then, all the fixing members 70 are removed from the first recesses 45 (see FIG. 12), and the plural coupling rings 23 are removed from the carrier 43 (see FIG. 11). Thereafter, the elastic membrane 10 is removed from the plural coupling rings 23.

When the elastic membrane 10 which has been subjected to maintenance or a new elastic membrane 10 is attached to the carrier 43 of the head body 2, the intermediate coupling ring 23 is held in advance by the inner-side coupling ring 23 and the outer-side coupling ring 23, and further the elastic membrane 10 is held in advance by the plural coupling rings (i.e., the inner-side coupling ring 23, the intermediate coupling ring 23 and the outer-side coupling ring 23) (see FIG. 11). Then, the plural coupling rings 23 which hold the elastic membrane 10 are moved toward the carrier 43, and the respective coupling rings 23 are inserted into the respective recesses (i.e., the second recess 46, the third recess 47 and the fourth recess 48) formed in the lower surface 43b of the carrier 43 (see FIG. 12). Thereafter, the fixing members 70 are inserted into the first recesses 45 formed in the upper surface 43c of the carrier 43 (see FIG. 13), and the fixing members 70 are rotated by the jig (not shown). When the fixing members 70 are rotated, the flanges 72 of the fixing members 70 are engaged with the inner-side engagement grooves 36 of the inner-side coupling rings 23 and the outer-side engagement grooves 37 of the outer-side coupling ring 23, respectively, through the inner-side openings 96 and the outer-side openings 97. Thus, the elastic membrane 10 which has been subjected to maintenance or the new elastic membrane 10 is attached to the carrier 43 of the head body 2.

In order to attach the elastic membrane 10 to the carrier 43 of the head body 2 again, the inner-side engagement groove 36 of the inner-side coupling ring 23 is required to face the inner-side opening 96 of the first recess 45, and the outer-side engagement groove 37 of the outer-side coupling ring 23 is required to face the outer-side opening 97 of the first recess 45. Specifically, it is necessary to position the inner-side coupling ring 23 and the outer-side coupling ring 23 accurately with respect to the plural first recesses 45, respectively, formed in the carrier 43 (i.e., with respect to the head body 2). Further, when the fixing member 70 is rotated, if the inner-side coupling ring 23 and/or the outer-side coupling ring 23 are moved relative to the intermediate coupling ring 23, these coupling rings 23 are liable to be damaged. Therefore, in order to reduce the burden of the worker who performs maintenance or replacement of the elastic membrane 10 and to prevent breakage of the coupling ring 23, it is preferable for the polishing head (substrate holding apparatus) 1 to have a positioning mechanism for fixing the relative positions between the inner-side coupling ring 23, the intermediate coupling ring 23 and the outer-side coupling ring 23. The preferred embodiments of the positioning mechanism will be described below with reference to FIGS. 16 to 21.

Figure 16:
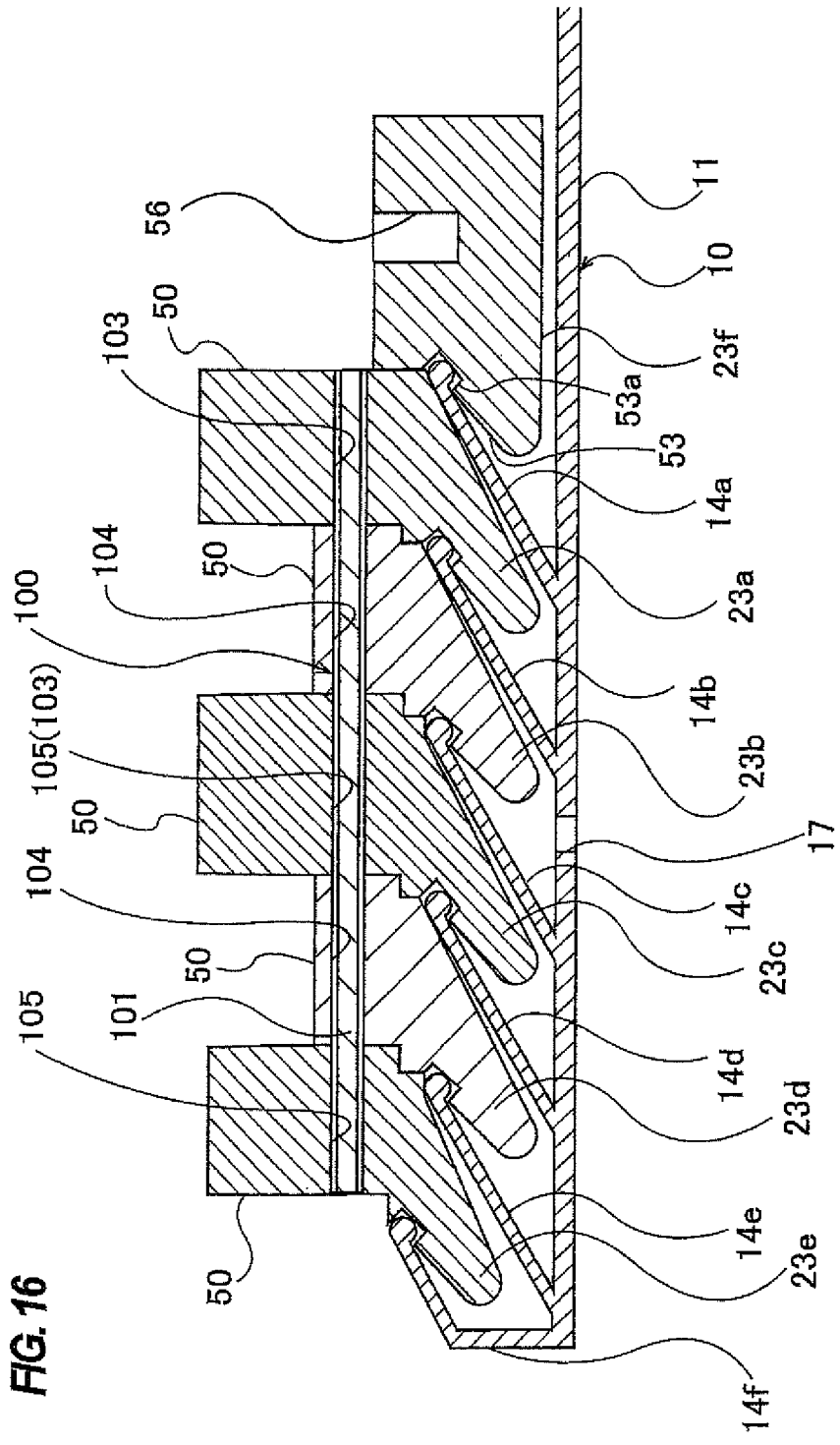
FIG. 16 is a cross-sectional view showing a positioning mechanism according to an embodiment.

FIG. 16 is a cross-sectional view showing the positioning mechanism according to one embodiment. The coupling rings 23a to 23e shown in FIG. 16 have the same structure as the coupling rings 23a to 23e shown in FIG. 5 except for the positioning mechanism 100 described below. The positioning mechanism 100 shown in FIG. 16 comprises a rod-like member 101, a first insertion hole 103 formed in the ring vertical portion 50 of the inner-side coupling ring 23 and configured to allow the rod-like member 101 to be inserted, a second insertion hole 104 formed in the ring vertical portion 50 of the intermediate coupling ring 23 and configured to allow the rod-like member 101 to be inserted, and a third insertion hole 105 formed in the ring vertical portion 50 of the outer-side coupling ring 23 and configured to allow the rod-like member 101 to be inserted.

The first insertion hole 103 extends horizontally and passes through the ring vertical portion 50 of the inner-side coupling ring 23. Similarly; the second insertion hole 104 extends horizontally and passes through the ring vertical portion 50 of the intermediate coupling ring 23, and the third insertion hole 105 extends horizontally and passes through the ring vertical portion 50 of the outer-side coupling ring 23.

When the intermediate coupling ring 23 is held by the inner-side coupling ring 23 and the outer-side coupling ring 23, these insertion holes 103, 104 and 105 formed in the respective coupling rings 23 can lie on a straight line. When the rod-like member 101 is inserted into the insertion holes 103, 104 and 105 lying on the straight line, the relative positions between the inner-side coupling ring 23, the intermediate coupling ring 23 and the outer-side coupling ring 23 are fixed.

In the embodiment shown in FIG. 16, the relative positions between the first coupling ring 23a, the second coupling ring 23b, the third coupling ring 23c, the fourth coupling ring 23d and the fifth coupling ring 23e are fixed by the single rod-like member 101. As described above, the third coupling ring 23c is the outer-side coupling ring 23 with respect to the second inner circumferential wall 14b and the third inner circumferential wall 14c, and is the inner-side coupling ring 23 with respect to the fourth inner circumferential wall 14d and the fifth inner circumferential wall 14e. Therefore, the insertion hole formed in the ring vertical portion 50 of the third coupling ring 23c serves as the third insertion hole 105 with respect to the second inner circumferential wall 14b and the third inner circumferential wall 14c, and serves as the first insertion hole 103 with respect to the fourth inner circumferential wall 14d and the fifth inner circumferential wall 14e.

In this manner, the relative positions between the first coupling ring 23a, the second coupling ring 23b, the third coupling ring 23c, the fourth coupling ring 23d and the fifth coupling ring 23e are fixed by the positioning mechanism 100 shown in FIG. 16. As a result, the burden of the worker who performs maintenance or replacement of the elastic membrane 10 can be reduced. Further, when the elastic membrane 10 is attached to the head body 2, the first coupling ring 23a, the second coupling ring 23b, the third coupling ring 23c, the fourth coupling ring 23d and the fifth coupling ring 23e can be prevented from being damaged.

Figure 17:
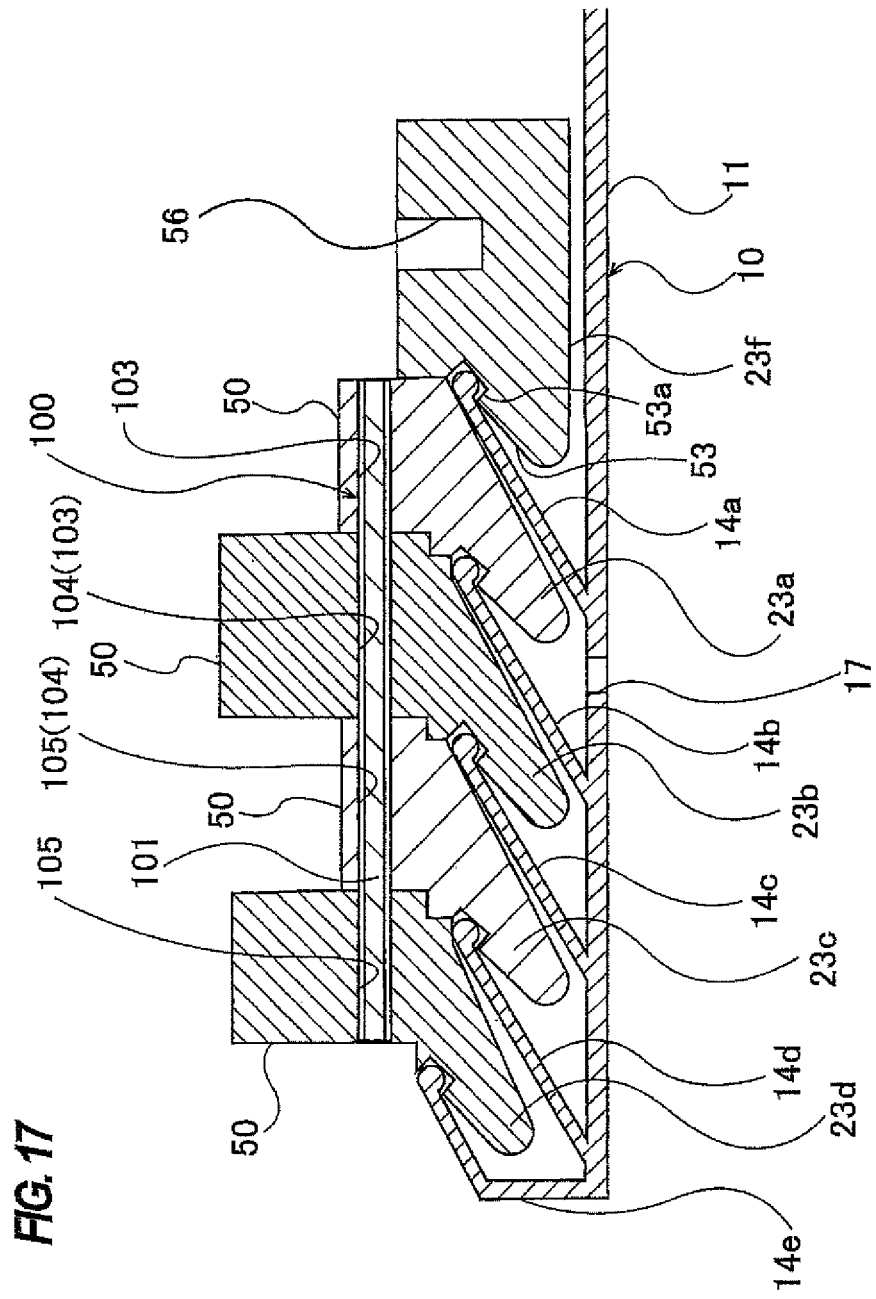
FIG. 17 is a view showing a modified example of the positioning mechanism shown in FIG. 16.

FIG. 17 is a view showing a modified example of the positioning mechanism 100 shown in FIG. 16. The elastic membrane 10 shown in FIG. 17 has four inner circumferential walls 14a, 14b, 14c and 14d configured as slope circumferential walls, and these four inner circumferential walls 14a, 14b, 14c and 14d are coupled to four coupling rings 23a, 23b, 23c and 23d.

In the elastic membrane 10 shown in FIG. 17, with respect to the first coupling ring 23a, the second coupling ring 23b and the third coupling ring 23c, the second inner circumferential wall 14b is an inner-side slope circumferential wall 14, and the third inner circumferential wall 14c is an outer-side slope circumferential wall 14. Specifically, with respect to the second inner circumferential wall 14b and the third inner circumferential wall 14c, the first coupling ring 23a is an inner-side coupling ring 23, the second coupling ring 23b is an intermediate coupling ring 23, and the third coupling ring 23c is an outer-side coupling ring 23. Similarly, with respect to the second coupling ring 23b, the third coupling ring 23c and the fourth coupling ring 23d, the third inner circumferential wall 14c is an inner-side slope circumferential wall 14, and the fourth inner circumferential wall 14d is an outer-side slope circumferential wall 14. Specifically, with respect to the third inner circumferential wall 14c and the fourth inner circumferential wall 14d, the second coupling ring 23b is an inner-side coupling ring 23, the third coupling ring 23c is an intermediate coupling ring 23, and the fourth coupling ring 23d is an outer-side coupling ring 23.

In the embodiment shown in FIG. 17, the relative positions between the first coupling ring 23a, the second coupling ring 23b, the third coupling ring 23c and the fourth coupling ring 23d are fixed by the single rod-like member 101. As described above, the second coupling ring 23b is an intermediate coupling ring 23 with respect to the second inner circumferential wall 14b and the third inner circumferential wall 14c, and is an inner-side coupling ring 23 with respect to the third inner circumferential wall 14c and the fourth inner circumferential wall 14d. Therefore, the insertion hole formed in the ring vertical portion 50 of the second coupling ring 23b serves as the second insertion hole 104 with respect to the second inner circumferential wall 14b and the third inner circumferential wall 14c, and serves as the first insertion hole 103 with respect to the third inner circumferential wall 14c and the fourth inner circumferential wall 14d. Further, the third coupling ring 23c is an outer-side coupling ring 23 with respect to the second inner circumferential wall 14b and the third inner circumferential wall 14c, and is an intermediate coupling ring 23 with respect to the third inner circumferential wall 14c and the fourth inner circumferential wall 14d. Therefore, the insertion hole formed in the ring vertical portion 50 of the third coupling ring 23c serves as the third insertion hole 105 with respect to the second inner circumferential wall 14b and the third inner circumferential wall 14c, and serves as the second insertion hole 104 with respect to the third inner circumferential wall 14c and the fourth inner circumferential wall 14d.

The relative positions between the four coupling rings 23a, 23b, 23c and 23d can be fixed by the positioning mechanism 100 shown in FIG. 17. As a result, the burden of the worker who performs maintenance or replacement of the elastic membrane 10 can be reduced. Further, when the elastic membrane 10 is attached to the head body 2, the first coupling ring 23a, the second coupling ring 23b, the third coupling ring 23c and the fourth coupling ring 23d can be prevented from being damaged.

In this manner, the inner-side coupling ring 23, the intermediate coupling ring 23 and the outer-side coupling ring 23 which are fixed in the relative positions by the positioning mechanism 100 can be arbitrarily selected from the plural coupling rings 23 arranged sequentially in a radial direction of the elastic membrane 10.

Figure 18A:
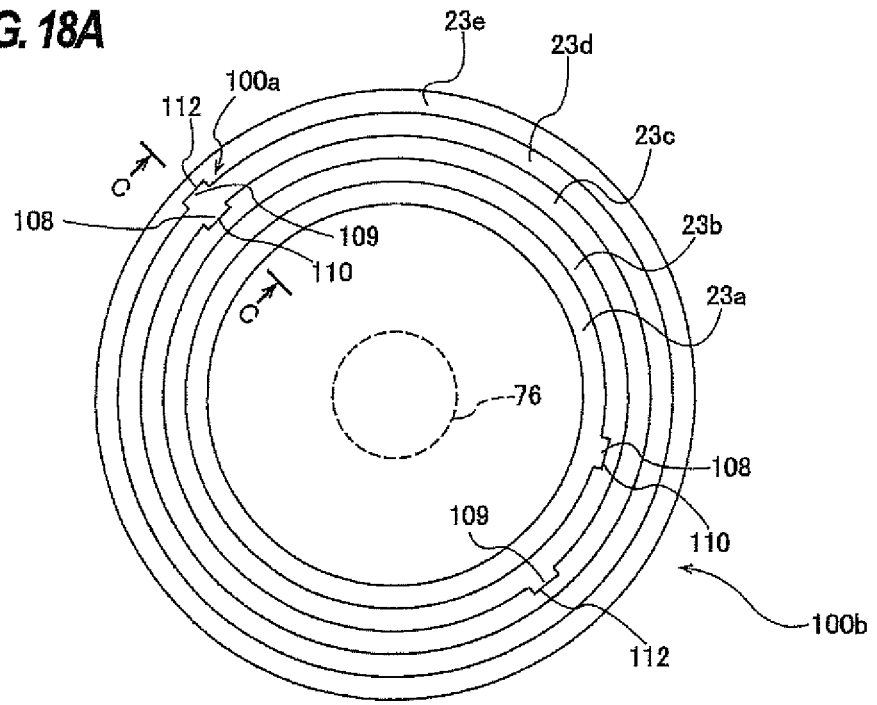
FIG. 18A is a schematic view showing positioning mechanisms according to another embodiment.
Figure 18B:
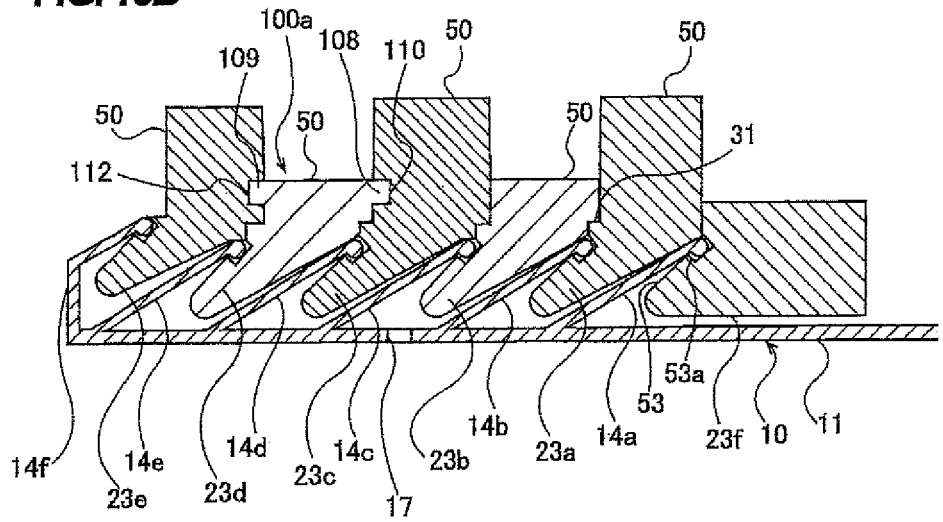
FIG. 18B is a cross-sectional view taken along line C-C of FIG. 18A.

FIG. 18A is a schematic view showing positioning mechanisms according to another embodiment, and corresponds to a view showing five coupling rings 23a, 23b, 23c, 23d and 23e which hold the elastic membrane 10 shown in FIG. 5 as viewed from above. In FIG. 18A, the above shaft portion 76 is shown by an imaginary line (dotted line). FIG. 18B is a cross-sectional view taken along line C-C of FIG. 18A. In FIG. 18B, a positioning mechanism 100a for fixing relative positions between the third coupling ring 23c serving as an inner-side coupling ring 23, the fourth coupling ring 23d serving as an intermediate coupling ring 23, and the fifth coupling ring 23e serving as an outer-side coupling ring 23 is shown. The coupling rings 23a to 23e shown in FIGS. 18A and 18B have the same configuration as the coupling rings 23a to 23e shown in FIG. 5 except for positioning mechanisms 100a and 100b described later.

The positioning mechanism 100a shown in FIG. 18B comprises a first engagement projection 108 and a second engagement projection 109 projecting respectively from the inner circumferential surface and the outer circumferential surface of the ring vertical portion 50 of the intermediate coupling ring 23 (i.e., the fourth coupling ring 23d), a first engagement recess 110 formed in the outer circumferential surface of the ring vertical portion 50 of the inner-side coupling ring 23 (i.e., the third coupling ring 23c) and engaged with the first engagement projection 108, and a second engagement recess 112 formed in the inner circumferential surface of the ring vertical portion 50 of the outer-side coupling ring 23 (i.e., the fifth coupling ring 23e) and engaged with the second engagement projection 109.

The relative positions between the inner-side coupling ring 23 (i.e., the third coupling ring 23c), the intermediate coupling ring 23 (i.e., the fourth coupling ring 23d) and the outer-side coupling ring 23 (i.e., the fifth coupling ring 23e) are fixed by allowing the first engagement projection 108 to engage with the first engagement recess 110 and allowing the second engagement projection 109 to engage with the second engagement recess 112.

The first engagement projection 108, the second engagement projection 109, the first engagement recess 110 and the second engagement recess 112 can be formed at arbitrary positions of the ring vertical portions 50 of the respective coupling rings 23 as long as the second engagement projection 109 is engageable with the second engagement recess 112 in a state where the first engagement projection 108 is engaged with the first engagement recess 110. More specifically, the first engagement projection 108 projects from the inner circumferential surface of the ring vertical portion 50 of the intermediate coupling ring 23 or the outer circumferential surface of the ring vertical portion 50 of the inner-side coupling ring 23, and the first engagement recess 110 engageable with the first engagement projection 108 is formed in the outer circumferential surface of the ring vertical portion 50 of the inner-side coupling ring 23 or the inner circumferential surface of the ring vertical portion 50 of the intermediate coupling ring 23. The second engagement projection 109 projects from the outer circumferential surface of the ring vertical portion 50 of the intermediate coupling ring 23 or the inner circumferential surface of the ring vertical portion 50 of the outer-side coupling ring 23, and the second engagement recess 112 engageable with the second engagement projection 109 is formed in the inner circumferential surface of the ring vertical portion 50 of the outer-side coupling ring 23 or the outer circumferential surface of the ring vertical portion 50 of the intermediate coupling ring 23.

In FIG. 18A, a positioning mechanism 100b for fixing the relative positions between the first coupling ring 23a, the second coupling ring 23b and the third coupling ring 23c is shown as another example of the first engagement projection 108, the second engagement projection 109, the first engagement recess 110 and the second engagement recess 112. In the case of the positioning mechanism 100b, the first coupling ring 23a is an inner-side coupling ring 23, the second coupling ring 23b is an intermediate coupling ring 23, and the third coupling ring 23c is an outer-side coupling ring 23.

In the positioning mechanism 100b, the first engagement projection 108 projects from the outer circumferential surface of the ring vertical portion 50 of the first coupling ring (inner-side coupling ring) 23a, and the first engagement recess 110 engageable with the first engagement projection 108 is formed in the inner circumferential surface of the ring vertical portion 50 of the second coupling ring (intermediate coupling ring) 23b. The second engagement projection 109 projects from the outer circumferential surface of the ring vertical portion 50 of the second coupling ring (intermediate coupling ring) 23b, and the second engagement recess 112 engageable with the second engagement projection 109 is formed in the inner circumferential surface of the ring vertical portion 50 of the third coupling ring (outer-side coupling ring) 23c. With this configuration, the relative positions between the first coupling ring 23a, the second coupling ring 23b and the third coupling ring 23c can be fixed.

In this manner, the relative positions between the first coupling ring 23a, the second coupling ring 23b, the third coupling ring 23c, the fourth coupling ring 23d and the fifth coupling ring 23e can be fixed by the two positioning mechanisms 100a and 100b shown in FIG. 18A. As a result, the burden of the worker who performs maintenance or replacement of the elastic membrane 10 can be reduced. Further, when the elastic membrane 10 is attached to the head body 2, the first coupling ring 23a, the second coupling ring 23b, the third coupling ring 23c, the fourth coupling ring 23d and the fifth coupling ring 23e can be prevented from being damaged.

Figure 19A:
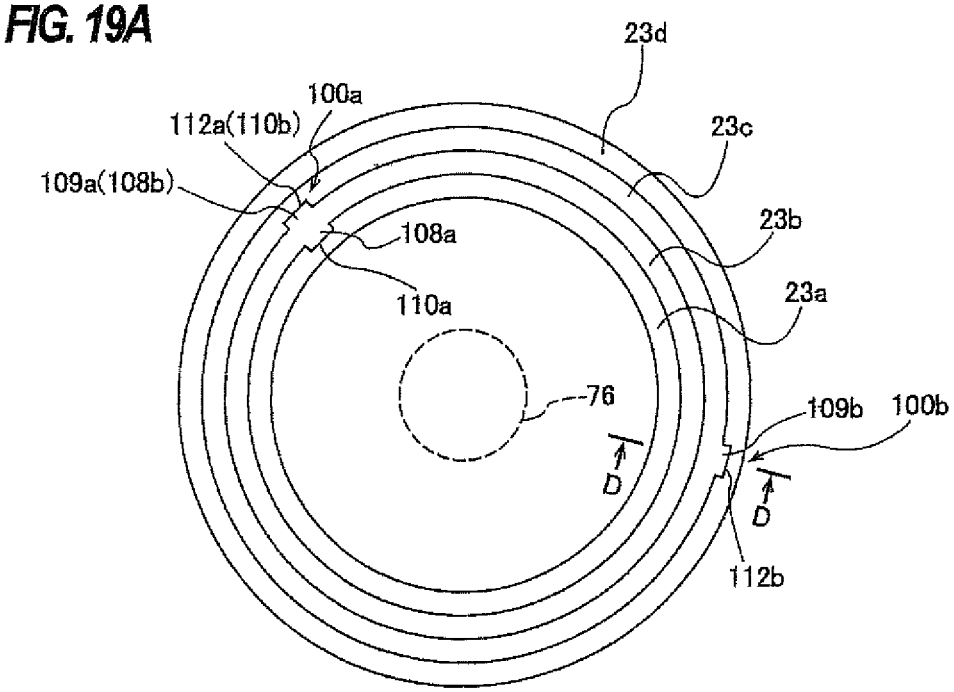
FIG. 19A is a schematic view showing a modified example of the positioning mechanisms shown in FIG. 18A.
Figure 19B:
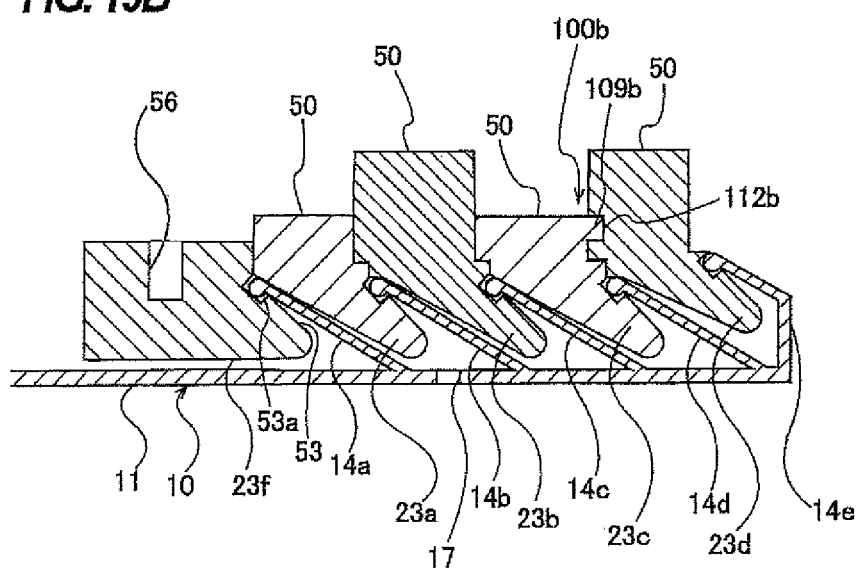
FIG. 19B is a cross-sectional view taken along line D-D of FIG. 19A.

FIG. 19A is a schematic view showing a modified example of the positioning mechanisms 100a and 100b shown in FIG. 18A. FIG. 19B is a cross-sectional view taken along line D-D of FIG. 19A. The elastic membrane 10 shown in FIG. 19B has four inner circumferential walls 14a, 14b, 14c and 14d configured as slope circumferential walls, and these four inner circumferential walls 14a, 14b, 14c and 14d are coupled to four coupling rings 23a, 23b, 23c and 23d. For the sake of the explanation, in the positioning mechanism 100a, the first engagement projection 108 is referred to as a first engagement projection 108a, the first engagement recess 110 is referred to as a first engagement recess 110a, the second engagement projection 109 is referred to as a second engagement projection 109a, and the second engagement recess 112 is referred to as a second engagement recess 112a. Similarly, in the positioning mechanism 100b, the first engagement projection 108 is referred to as a first engagement projection 108b, the first engagement recess 110 is referred to as a first engagement recess 110b, the second engagement projection 109 is referred to as a second engagement projection 109b, and the second engagement recess 112 is referred to as a second engagement recess 112b.

In the embodiment shown in FIGS. 19A and 19B, the relative positions between the first coupling ring 23a, the second coupling ring 23b and the third coupling ring 23c are fixed by the positioning mechanism 100a. More specifically, the positioning mechanism 100a comprises a first engagement projection 108a and a second engagement projection 109a projecting respectively from the inner circumferential surface and the outer circumferential surface of the ring vertical portion 50 of the intermediate coupling ring 23 (i.e., the second coupling ring 23b), a first engagement recess 110a formed in the outer circumferential surface of the ring vertical portion 50 of the inner-side coupling ring 23 (i.e., the first coupling ring 23a) and engaged with the first engagement projection 108a, and a second engagement recess 112a formed in the inner circumferential surface of the ring vertical portion 50 of the outer-side coupling ring 23 (i.e., the third coupling ring 23c) and engaged with the second engagement projection 109a.

The relative positions between the second coupling ring 23b, the third coupling ring 23c and the fourth coupling ring 23d are fixed by the positioning mechanism 100b. The second engagement projection 109a of the positioning mechanism 100a serves as a first engagement projection 108b of the positioning mechanism 100b. Similarly, the second engagement recess 112a of the positioning mechanism 100a serves as a first engagement recess 110b of the positioning mechanism 100b. As shown in FIG. 19B, the second engagement projection 109b of the positioning mechanism 100b is formed on the outer circumferential surface of the third coupling ring 23c as the intermediate coupling ring, and the second engagement recess 112b is formed in the inner circumferential surface of the fourth coupling ring 23d as the outer-side coupling ring.

The relative positions between the four coupling rings 23a, 23b, 23c and 23d can be fixed by the positioning mechanisms 100*a* and 100*b* shown in FIGS. 19A and 19B. As a result, the burden of the worker who performs maintenance or replacement of the elastic membrane 10 can be reduced. Further, when the elastic membrane 10 is attached to the head body 2, the first coupling ring 23*a*, the second coupling ring 23*b*, the third coupling ring 23*c* and the fourth coupling ring 23*d* can be prevented from being damaged.

In this manner, the inner-side coupling ring 23, the intermediate coupling ring 23 and the outer-side coupling ring 23 which are fixed in relative positions by the positioning mechanisms 100*a* and 100*b* can be arbitrarily selected from the plural coupling rings 23 arranged sequentially in a radial direction of the elastic membrane 10.

Figure 20A:
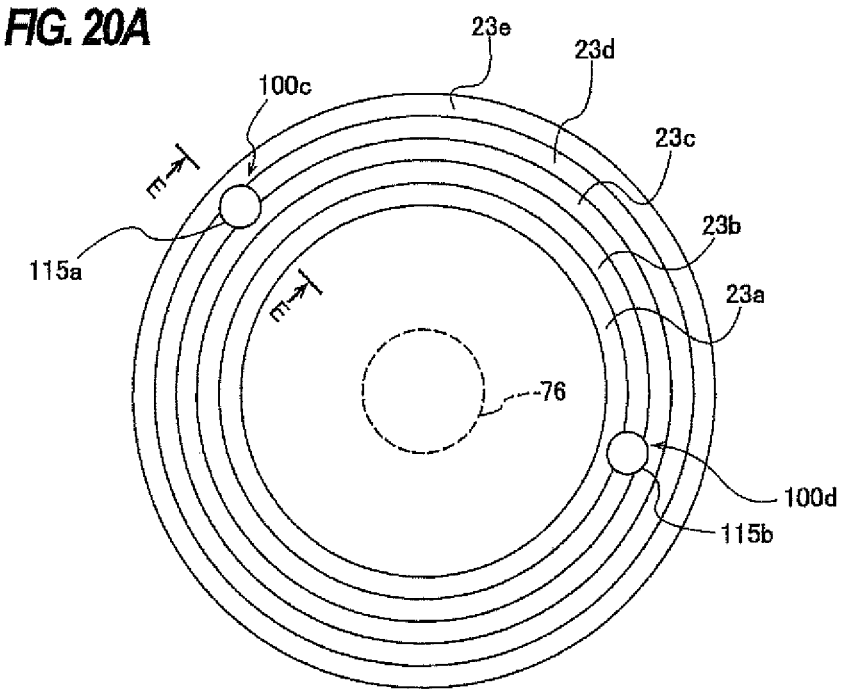
FIG. 20A is a schematic view showing positioning mechanisms according to still another embodiment.
Figure 20B:
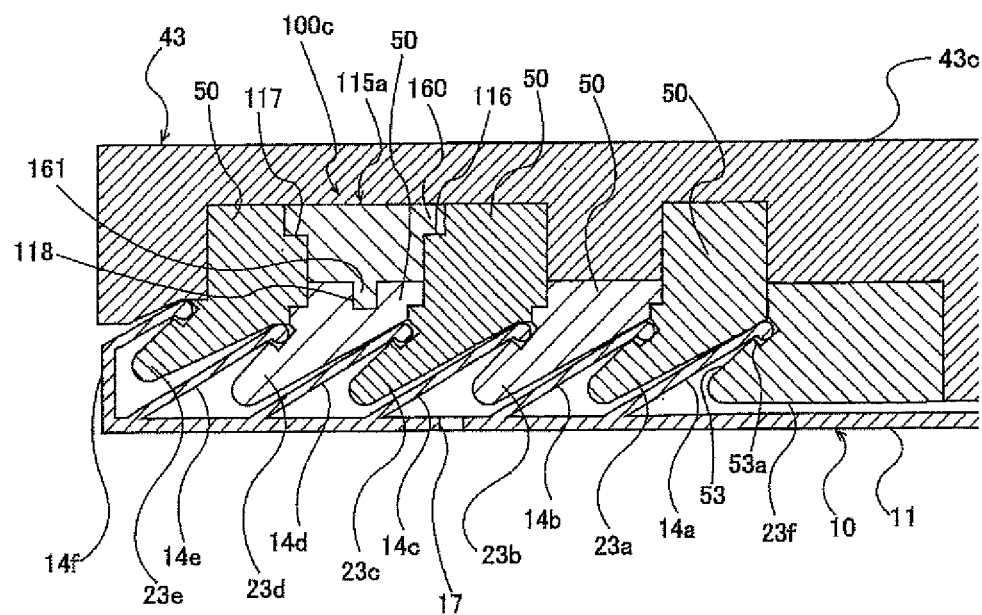
FIG. 20B is a cross-sectional view taken along line E-E of FIG. 20A.

FIG. 20A is a schematic view showing positioning mechanisms according to still another embodiment, and corresponds to a view showing five coupling rings 23*a*, 23*b*, 23*c*, 23*d* and 23*e* which hold the elastic membrane 10 shown in FIG. 5 as viewed from above. In FIG. 20A, the above shaft portion 76 is shown by an imaginary line (dotted line). FIG. 20B is a cross-sectional view taken along line E-E of FIG. 20A. In FIG. 20B, not only the five coupling rings 23*a*, 23*b*, 23*c*, 23*d* and 23*e*, but also the carrier 43 is shown. The coupling rings 23*a* to 23*e* shown in FIGS. 20A and 20B have the same configuration as the coupling rings 23*a* to 23*e* shown in FIG. 5 except for positioning mechanisms 100*c* and 100*d* described below.

The positioning mechanism 100*c* shown in FIGS. 20A and 20B has a position alignment member 115*a* fixed to the lower surface of the carrier 43 of the head body 2. The position alignment member 115*a* has a flange portion 160 formed at its upper end portion, and a lower engagement projection 161 formed at its lower end portion. Further, the positioning mechanism 100*c* comprises an inner-side step portion 116 formed on the outer circumferential surface of the ring vertical portion 50 of the inner-side coupling ring 23 and engaged with the flange portion 160, an outer-side step portion 117 formed on the inner circumferential surface of the ring vertical portion 50 of the outer-side coupling ring 23 and engaged with the flange portion 160, and an engagement recess 118 formed in the upper surface of the ring vertical portion 50 of the intermediate coupling ring 23 and engaged with the lower engagement projection 161.

As shown in FIG. 20B, when the lower engagement projection 161 of the position alignment member 115*a* is engaged with the engagement recess 118 of the fourth coupling ring (intermediate coupling ring) 23*d*, the flange portion 160 of the position alignment member 115*a* is engaged with the inner-side step portion 116 of the third coupling ring (inner-side coupling ring) 23*c* and the outer-side step portion 117 of the fifth coupling ring (outer-side coupling ring) 23*e*. With this configuration, the relative positions between the third coupling ring 23*c*, the fourth coupling ring 23*d* and the fifth coupling ring 23*e* can be fixed.

In FIG. 20A, a positioning mechanism 100*d* for fixing the relative positions between the first coupling ring 23*a*, the second coupling ring 23*b* and the third coupling ring 23*c* by a position alignment member 115*b* having the same configuration as the position alignment member 115*a* is also shown. The positioning mechanism 100*d* has the same configuration as the positioning mechanism 100*a* shown in FIG. 18B, and will not be described in duplication.

In this manner, the relative positions between the first coupling ring 23*a*, the second coupling ring 23*b*, the third coupling ring 23*c*, the fourth coupling ring 23*d* and the fifth coupling ring 23*e* can be fixed by the two positioning mechanisms 100*c* and 100*d* shown in FIG. 20A. As a result, the burden of the worker who performs maintenance or replacement of the elastic membrane 10 can be reduced. Further, when the elastic membrane 10 is attached to the head body 2, the first coupling ring 23*a*, the second coupling ring 23*b*, the third coupling ring 23*c*, the fourth coupling ring 23*d* and the fifth coupling ring 23*e* can be prevented from being damaged.

Figure 21:
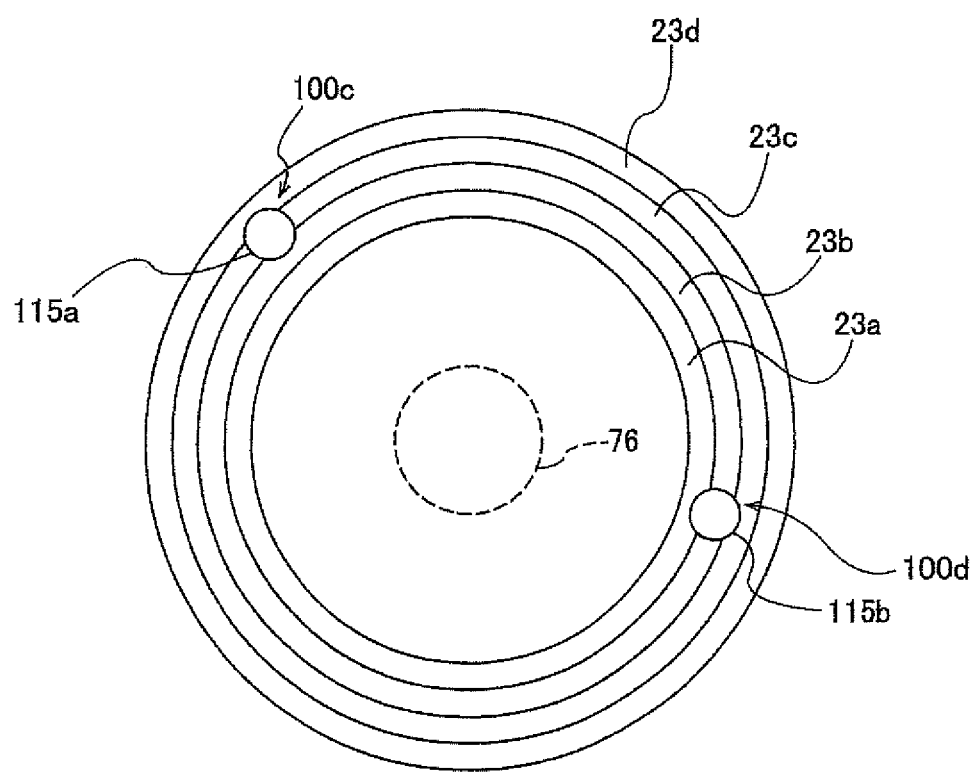
FIG. 21 is a schematic view showing a modified example of the positioning mechanisms shown in FIG. 20A.

FIG. 21 is a schematic view showing a modified example of the positioning mechanisms 100*c* and 100*d* shown in FIG. 20A. The relative positions between the four coupling rings 23*a*, 23*b*, 23*c* and 23*d* can be fixed by the positioning mechanism 100*c* and 100*d* shown in FIG. 21. The four inner circumferential walls 14*a*, 14*b*, 14*c* and 14*d* (not shown) configured as the slope circumferential walls are coupled to the four coupling rings 23*a*, 23*b*, 23*c* and 23*d* shown in FIG. 21.

The positioning mechanism 100*c* shown in FIG. 21 fixes the relative positions between the second coupling ring 23*b*, the third coupling ring 23*c* and the fourth coupling ring 23*d* by the position alignment member 115*a* (see FIG. 20B). In the positioning mechanism 100*c*, the second coupling ring 23*b* is an inner-side coupling ring, the third coupling ring 23*c* is an intermediate coupling ring, and the fourth coupling ring 23*d* is an outer-side coupling ring. The positioning mechanism 100*d* fixes the relative positions between the first coupling ring 23*a*, the second coupling ring 23*b* and the third coupling ring 23*c* by the position alignment member 115*b* having the same configuration as the position alignment member 115*a*. In the positioning mechanism 100*d*, the first coupling ring 23*a* is an inner-side coupling ring, the second coupling ring 23*b* is an intermediate coupling ring, and the third coupling ring 23*c* is an outer-side coupling ring.

The relative positions between the four coupling rings 23*a*, 23*b*, 23*c* and 23*d* can be fixed by the positioning mechanisms 100*c* and 100*d* shown in FIG. 21. As a result, the burden of the worker who performs maintenance or replacement of the elastic membrane 10 can be reduced. Further, when the elastic membrane 10 is attached to the head body 2, the first coupling ring 23*a*, the second coupling ring 23*b*, the third coupling ring 23*c* and the fourth coupling ring 23*d* can be prevented from being damaged.

In this manner, the inner-side coupling ring 23, the intermediate coupling ring 23 and the outer-side coupling ring 23 which are fixed in relative positions by the positioning mechanisms 100*c* and 100*d* can be arbitrarily selected from the plural coupling rings 23 arranged sequentially in a radial direction of the elastic membrane 10.

In the above-described embodiments, at least two adjacent inner circumferential walls 14 of the plural inner circumferential walls 14 are configured as slope circumferential walls inclined radially inwardly. The inner circumferential walls 14 other than the inner circumferential walls 14 configured as the slope circumferential walls have an arbitrary shape. For example, as shown FIG. 9, the inner circumferential walls 14*d* and 14*e* may be configured as the slope circumferential walls, and the inner circumferential walls 14*a* to 14*c* other than the inner circumferential walls 14*d* and 14*e* may be configured as the inner circumferential walls each having the slope portion 57 inclined radially inwardly from the contact portion 11 and the horizontal portion 58 extending horizontally from the slope portion 57. Although not shown in the drawing, in the elastic membrane 10 shown in FIG. 9, the inner circumferential wall 14*b* may be configured as an inner circumferential wall having a slope portion inclined radially outwardly from the contact portion 11, and a horizontal portion extending horizontally in a radially outward direction from the slope portion.

The above description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate holding apparatus comprising:
    an elastic membrane that forms a plurality of pressure chambers for pressing a substrate; and
    a head body to which the elastic membrane is coupled;
    wherein the elastic membrane comprises:
        a contact portion to be brought into contact with the substrate for pressing the substrate against a polishing pad;
        an edge circumferential wall extending upwardly from a peripheral edge of the contact portion; and
        a plurality of inner circumferential walls arranged radially inwardly of the edge circumferential wall and extending upwardly from the contact portion;
    wherein at least two adjacent inner circumferential walls of the plurality of inner circumferential walls comprise slope circumferential walls inclined radially inwardly; and
    the slope circumferential walls are inclined radially inwardly in their entirety from their lower ends to upper ends, and extend upwardly, and
    wherein the head body has inclined surfaces to which an upper end of each slope circumferential walls is attached.

2. The substrate holding apparatus according to claim 1, wherein the slope circumferential walls extend substantially parallel to each other.

3. The substrate holding apparatus according to claim 1, wherein one of the slope circumferential walls is arranged adjacent to the edge circumferential wall.

4. The substrate holding apparatus according to claim 1, wherein, when the elastic membrane is viewed in a vertical cross-section, at least a part of the slope circumferential wall located radially outward, of the adjacent inclined peripheral walls is located above the slope circumferential wall located radially inward, of the adjacent inclined peripheral walls.

5. The substrate holding apparatus according to claim 1, wherein the head body comprises at least one coupling ring to which the elastic membrane is coupled; and
    the upper end of each slope circumferential walls is attached to the coupling ring.

6. The substrate holding apparatus according to claim 5, wherein the coupling ring comprises a ring vertical portion and a ring slope portion which is inclined radially outwardly from the ring vertical portion and extends downwardly; and
    the ring slope portion has an inner circumferential surface and an outer circumferential surface to limit a deformation of the slope circumferential wall.

7. An elastic membrane for use in a substrate holding apparatus, comprising:
    a contact portion to be brought into contact with a substrate for pressing the substrate against a polishing pad;
    an edge circumferential wall extending upwardly from a peripheral edge of the contact portion; and
    a plurality of inner circumferential walls arranged radially inwardly of the edge circumferential wall and extending upwardly from the contact portion,
    wherein at least two adjacent inner circumferential walls of the plurality of inner circumferential walls comprise slope circumferential walls inclined radially inwardly;
    the slope circumferential walls are inclined radially inwardly in their entirety from their lower ends to upper ends, and extend upwardly, and
    each of the slope circumferential walls has an upper end attached to an inclined surface formed in a head body of the substrate holding apparatus.

8. The elastic membrane according to claim 7, wherein the slope circumferential walls extend substantially parallel to each other.

9. The elastic membrane according to claim 7, wherein one of the slope circumferential walls is arranged adjacent to the edge circumferential wall.

10. The elastic membrane according to claim 7, wherein, when the elastic membrane is viewed in a vertical cross-section, at least a part of the slope circumferential wall located radially outward, of the adjacent inclined peripheral walls is located above the slope circumferential wall located radially inward, of the adjacent inclined peripheral walls.

11. A substrate holding apparatus comprising:
    an elastic membrane that forms a plurality of pressure chambers for pressing a substrate; and
    a head body to which the elastic membrane is coupled;
    wherein the elastic membrane comprises:
        a contact portion to be brought into contact with the substrate for pressing the substrate against a polishing pad;
        an edge circumferential wall extending upwardly from a peripheral edge of the contact portion; and
        a plurality of inner circumferential walls arranged radially inwardly of the edge circumferential wall and extending upwardly from the contact portion;
    wherein at least two adjacent inner circumferential walls of the plurality of inner circumferential walls comprise slope circumferential walls inclined radially inwardly; and
    the slope circumferential walls are inclined radially inwardly in their entirety from their lower ends to upper ends, and extend upwardly, and
    wherein, when the elastic membrane is viewed in a vertical cross-section, at least a part of the slope circumferential wall located radially outward, of the adjacent inclined peripheral walls is located above the slope circumferential wall located radially inward, of the adjacent inclined peripheral walls.

12. The substrate holding apparatus according to claim 11, wherein the slope circumferential walls extend substantially parallel to each other.

13. The substrate holding apparatus according to claim 11, wherein one of the slope circumferential walls is arranged adjacent to the edge circumferential wall.

14. An elastic membrane for use in a substrate holding apparatus, comprising:
    a contact portion to be brought into contact with a substrate for pressing the substrate against a polishing pad;
    an edge circumferential wall extending upwardly from a peripheral edge of the contact portion; and
    a plurality of inner circumferential walls arranged radially inwardly of the edge circumferential wall and extending upwardly from the contact portion, wherein at least two adjacent inner circumferential walls of the plurality of inner circumferential walls comprise slope circumferential walls inclined radially inwardly;

the slope circumferential walls are inclined radially inwardly in their entirety from their lower ends to upper ends, and extend upwardly, and wherein, when the elastic membrane is viewed in a vertical cross-section, at least a part of the slope circumferential wall located radially outward, of the adjacent inclined peripheral walls is located above the slope circumferential wall located radially inward, of the adjacent inclined peripheral walls.

15. The elastic membrane according to claim 14, wherein the slope circumferential walls extend substantially parallel to each other.

16. The elastic membrane according to claim 14, wherein one of the slope circumferential walls is arranged adjacent to the edge circumferential wall.

\* \* \* \* \*